(12) United States Patent
Becker et al.

(10) Patent No.: US 9,097,757 B2
(45) Date of Patent: Aug. 4, 2015

(54) SWITCHING ELEMENT SYSTEM AND METHOD

(75) Inventors: Alvin G. Becker, Austin, TX (US);
James A. Reimund, Georgetown, TX (US); Naji S. Norder, Pflugerville, TX (US); James E. Nicholson, Austin, TX (US); Kyle R. Bryson, Austin, TX (US)

(73) Assignee: National Instruments Corporation, Austin, TX (US)

( * ) Notice: Subject to any disclaimer, the term of this patent is extended or adjusted under 35 U.S.C. 154(b) by 1001 days.

(21) Appl. No.: 13/087,154

(22) Filed: Apr. 14, 2011

(65) Prior Publication Data
US 2012/0262008 A1 Oct. 18, 2012

(51) Int. Cl.
*H02B 1/24* (2006.01)
*G01R 31/28* (2006.01)

(52) U.S. Cl.
CPC ....... *G01R 31/2844* (2013.01); *Y10T 29/49105* (2015.01)

(58) Field of Classification Search
CPC .............................. H03K 17/102; H04L 43/50
USPC ....................... 307/113; 370/16, 241; 340/228
See application file for complete search history.

(56) References Cited

U.S. PATENT DOCUMENTS

| | | | |
|---|---|---|---|
| 3,922,537 A | 11/1975 | Jackson | |
| 4,173,713 A * | 11/1979 | Giesken et al. | 370/374 |
| 4,300,207 A | 11/1981 | Eivers et al. | |
| 5,377,182 A * | 12/1994 | Monacos | 370/219 |
| 5,406,138 A * | 4/1995 | Srinivasan et al. | 326/41 |
| 5,774,427 A | 6/1998 | Rebeaud | |
| 5,932,936 A * | 8/1999 | Potthast et al. | 307/113 |
| 6,346,744 B1 * | 2/2002 | Geller | 257/724 |
| 6,417,651 B1 * | 7/2002 | Kronberg | 323/255 |
| 6,525,280 B2 | 2/2003 | Chan et al. | |
| 6,531,668 B1 | 3/2003 | Ma | |
| 6,741,479 B2 | 5/2004 | Korber et al. | |
| 6,816,044 B2 | 11/2004 | Mader et al. | |
| 6,880,235 B2 | 4/2005 | Ma | |

(Continued)

FOREIGN PATENT DOCUMENTS

EP 0594807 B1 5/1994

OTHER PUBLICATIONS

American Zettler, Inc, AZ767 SPDT Subminiature Power Relay, Mar. 10, 2010, http://www.azettler.com/pdfs/az767.pdf, pp. 1-2.*

(Continued)

*Primary Examiner* — Jared Fureman
*Assistant Examiner* — Alfonso Perez Borroto
(74) *Attorney, Agent, or Firm* — Meyertons Hood Kivlin Kowert & Goetzel, P.C.; Jeffrey C. Hood

(57) ABSTRACT

A 2×2 switching element that includes first and second relays each having a first terminal, a second terminal and a third terminal, wherein the first and second relays each operate between a first state to connect the first terminal to the second terminal and a second state to connect the first terminal to the third terminal. The second terminals and third terminals, respectively, of the first and second relays are coupled to one another. The 2×2 switching element is selectively operable between: a first switching state where the first relay is operated in the first state and the second relay is operated in the second state, and a second switching state where the first relay is operated in the second state and the second relay is operated in the second state.

10 Claims, 9 Drawing Sheets

(56) References Cited

U.S. PATENT DOCUMENTS

| | | | |
|---|---|---|---|
| 6,888,420 B2* | 5/2005 | Schaffner et al. | 333/101 |
| 6,940,363 B2 | 9/2005 | Zipper et al. | |
| 6,951,941 B2* | 10/2005 | Kwiatkowski | 546/16 |
| 7,446,634 B2 | 11/2008 | Jeong et al. | |
| 7,737,810 B2 | 6/2010 | Chan et al. | |
| 8,154,365 B2 | 4/2012 | Chan et al. | |
| 8,203,319 B2 | 6/2012 | Fujita et al. | |
| 8,270,054 B2 | 9/2012 | Kim | |
| 8,300,422 B2 | 10/2012 | Nagasaki | |
| 8,339,764 B2 | 12/2012 | Steeneken et al. | |
| 2003/0043015 A1* | 3/2003 | Gershfeld | 340/2.28 |
| 2005/0270137 A1* | 12/2005 | Yarbrough et al. | 340/2.28 |
| 2007/0025257 A1* | 2/2007 | Xu | 370/241 |
| 2010/0277267 A1 | 11/2010 | Bogert et al. | |
| 2011/0127853 A1 | 6/2011 | Fujita et al. | |
| 2012/0262007 A1 | 10/2012 | Becker et al. | |
| 2012/0262009 A1 | 10/2012 | Becker et al. | |
| 2012/0286588 A1 | 11/2012 | Steeneken et al. | |
| 2012/0286846 A1 | 11/2012 | Wunnicke et al. | |
| 2012/0313723 A1 | 12/2012 | Rofougaran et al. | |
| 2012/0318650 A1 | 12/2012 | Peroulis et al. | |

OTHER PUBLICATIONS

"Printed circuit board;" Wikipedia, page last modified on Apr. 29, 2013, retrieved from <http://en.wikipedia.org/wiki/Printed_Circuit_Board> on May 6, 2013; pp. 1-18.

"Sorting Networks and the END search algorithm," Sorting Networks, http://www.cs.brandeis.edu/~hugues/sorting_networks.html, 3 pages. (Retrieved Jul. 27, 2010).

"Sorting Networks," Mar. 2, 2005, 9 pages.

"Bitonic sort," Sorting networks, http://www.iti.fh-flensburg.de/lang/algorithmen/sortieren/bitonic/bitonicen.htm, 7 pages. (Retrieved Jul. 27, 2010).

"Odd-even mergesort," Sorting networks, http://www.iti.fh-flensburg.de/lang/algorithmen/sortieren/networks/oemen.htm, 4 pages. (Retrieved Jul. 27, 2010).

"Shellsort," Sorting algorithms, http://www.iti.fh-flensburg.de/lang/algorithmen/sortieren/shell/shellen.htm, 6 pages. (Retrieved Jul. 27, 2010).

"Sorting Networks—Wolfram Demonstrations Project," http://demonstrations.wolfram.com/SortingNetworks/, 3 pages. (Retrieved Jul. 27, 2010).

"Sorting Networks," http://www.cs.uky.edu/~lewis/essays/algorithms/sortnets/sort-net.html, 5 pages. (Retrieved Jul. 27, 2010).

"Sorting Networks," http://pages.ripco.net/~jgamble/nw.html, 2 pages. (Retrieved Jul. 27, 2010).

"The 0-1-principle," Sorting networks, http://www.iti.fh-flensburg.de/lang/algorithmen/sortieren/networks/nulleinsen.htm, 2 pages. (Retrieved Jul. 27, 2010).

"Sorting Network," Wikipedia, the free encyclopedia, http://en.wikipedia.org/wiki/Sorting_network, 3 pages. (Retrieved Dec. 9, 2010).

"Bubble Sort," Wikipedia, the free encyclopedia, http://en.wikipedia.org/wiki/Bubble_sort, 5 pages. (Retrieved Jan. 3, 2011).

"Sorting Algorithm Animations," http://www.sorting-algorithms.com/, 2 pages. (Retrieved Jan. 3, 2011).

Yuk, et al., "Scalable RF MEMS Switch Matrices: Methodology and Design," IEEE Transactions on Microwave Theory and Techniques, vol. 57, No. 6, Jun. 2009, pp. 1612-1621.

Yuk, et al., "Monolithic Crossbar MEMS Switch Matrix," IEEE MTT-S International Microwave Symposium Digest, 2008, pp. 129-132.

Daneshmand, et al., "Monolithic RF MEMS Switch Matrix Integration," IEEE MTT-S International Microwave Symposium Digest, 2006, pp. 140-143.

Daneshmand, et al., "C-Type and R-Type RF MEMS Switches for Redundancy Switch Matrix Applications," IEEE MTT-S International Microwave Symposium Digest, 2006, pp. 144-147.

Marcus, Michael J., "The Theory of Connecting Networks and Their Complexity: A Review," Proceedings of the the IEEE, vol. 65, No. 9, Sep. 1977, pp. 1263-1271.

Alvin G. Becker, James A. Reimund, Naji S. Norder, James E. Nicholson, Kyle R. Bryson, "Switch Matrix Modeling System and Method," U.S. Appl. No. 13/087,064, filed Apr. 14, 2011, 69 pages.

Alvin G. Becker, James A. Reimund, Naji S. Norder, James E. Nicholson, Kyle R. Bryson, "Switch Matrix System and Method," U.S. Appl. No. 13/087,198, filed Apr. 14, 2011, 69 pages.

* cited by examiner

SWITCHING ELEMENT SYSTEM AND METHOD

BACKGROUND OF THE INVENTION

1. Field of the Invention

This invention relates to switches, and more particularly to systems and methods for designing and implementing topologies for switch matrices.

2. Description of the Related Art

A relay is an electrical switch that opens and closes an electrically conductive path under the control of another electrical circuit. A switch matrix typically includes a plurality of relays used to selectively interconnect electrical paths for routing a signal. By opening and closing one or more relays within the switch matrix, a conductive path is created, thereby enabling a signal to be routed through the switch matrix. For example, a particular set of relays may be closed to connect a given input to a given output of the switch matrix. Switching is often implemented in test and measurement systems to automate routing of signals from one device to another. For example, a measurement device (e.g., voltmeter) may be coupled to an output of a switch having a plurality of inputs each coupled to a respective device under test (DUT). During operation, the measurement device may be used to take measurements from each of the DUT's by sequentially closing sets of relays, one after the other, to sequentially connect the inputs of the switch to outputs for each of the DUTs. Accordingly, switches may provide for simplified wiring, such that a test system can easily and dynamically modify internal connection paths without external manual intervention (e.g., without a user having to physically reroute cabling between devices). Similar switching techniques may be used in various operations that require dynamic routing of signals between devices.

Unfortunately, as the size of a switch matrix increases (e.g., the number of inputs and outputs increases), the number of relays may be increase to provide the desired connectivity. For example, an 8×8 cross-point matrix (e.g., a matrix having eight inputs and eight outputs) may employ one-hundred twenty-eight relays (e.g., of 1-Form-C type) to provide connectivity between each of the inputs and outputs. Increasing the number of relays may add to complexity and cost of the switching system. Moreover, conductive paths within relays can disrupt signals transmitted through the switch. For example, in the case of routing radio-frequency (RF) signals through a switch, dead-end paths ("stubs") may form a capacitive load that result in reflections, thereby creating interference (e.g., reflections) that degrades the signal. In some instances, signal performance may be degraded simply by routing of the signal through the relays. For example, a relatively "stub-less" design may have degraded signal performance due to an increasing number of relays within the signal paths. Further, the complexity of the switch may increase complexity with regard to modeling the switch for the determination of how to efficiently route signals through the switch. For example, with an increasing number of inputs and outputs, it may be difficult to model the increasing number of valid routing scenarios.

Accordingly, it is desirable to provide a simple and effective systems and method for designing and implementing topologies for switching.

SUMMARY

Described herein are embodiments relating to switch matrices systems and methods. For example, in some embodiments, provided is a 2×2 switching element that includes a first relay having a first terminal, a second terminal and a third terminal, wherein the first relay operates between a first state to connect the first terminal of the first relay to the second terminal of the first relay and a second state to connect the first terminal of the first relay to the third terminal of the first relay, and a second relay having a first terminal, a second terminal and a third terminal, wherein the second relay selectively operates between a first state to connect the first terminal of the second relay to the second terminal of the second relay and a second state configured to connect the first terminal of the second relay to the third terminal of the second relay. The second terminals of the first and second relays are coupled to one another, the third terminals of the first and second relays are coupled to one another. The 2×2 switching element is selectively operable between: a first switching state where the first relay is operated in the first state to connect the first terminal of the first relay to the second terminal of the first relay and the second relay is operated in the second state to connect the first terminal of the second relay to the third terminal of the second relay, and a second switching state where the first relay is operated in the second state to connect the first terminal of the first relay to the third terminal of the first relay and the second relay is operated in the second state to connect the first terminal of the second relay to the second terminal of the second relay.

In some embodiments, provided is a method of manufacturing a 2×2 switching element that includes coupling a second terminal of a first relay to a second terminal of a second relay and coupling a third terminal of a first relay to a third terminal of a second relay. The first relay has a first terminal, the second terminal and the third terminal, wherein the first relay operates between a first state to connect the first terminal of the first relay to the second terminal of the first relay and a second state to connect the first terminal of the first relay to the third terminal of the first relay. The second relay has a first terminal, the second terminal and the third terminal, where the second relay selectively operates between a first state to connect the first terminal of the second relay to the second terminal of the second relay and a second state configured to connect the first terminal of the second relay to the third terminal of the second relay. The 2×2 switching element is selectively operable between: a first switching state where the first relay is operated in the first state to connect the first terminal of the first relay to the second terminal of the first relay and the second relay is operated in the second state to connect the first terminal of the second relay to the third terminal of the second relay, and a second switching state where the first relay is operated in the second state to connect the first terminal of the first relay to the third terminal of the first relay and the second relay is operated in the second state to connect the first terminal of the second relay to the second terminal of the second relay.

In some embodiments, provided is a switching assembly that includes a printed circuit board (PCB) having a first side and a second side, wherein the first side comprises a top or bottom face of the PCB and the second side comprises the other of the bottom or top face of the PCB, a switching element that includes a first relay disposed on the first side of the PCB, wherein the first relay includes: an input, a first output and a second output, wherein the first relay is selectively configurable to route electrical signals from the input of the first relay to one of the first or second outputs of the first relay, and a second relay disposed on the second side of the PCB, wherein the second relay includes: an input, a first output, and a second output, wherein the second relay is selectively configurable to route electrical signals from the input of the second relay to one of the first or second outputs of the second relay. The assembly also includes a first conductive inlet path coupled to the input of the first relay, a second conductive input path coupled the input of the second relay, a first conductive outlet path coupled to both of the first outputs of the first and second relays, and a second conductive outlet path coupled to both of the second outputs of the first and second relays.

In some embodiments, provided is a switch system having a plurality of switch inputs, a plurality of switch outputs, a switch matrix comprising a plurality of 2×2 switching elements to selectively couple one or more of the plurality of switch inputs to one or more of the plurality of switch outputs during use to provide one or more paths for routing signals from one or more of the switch inputs to one or more of the switch outputs during use.

In some embodiments, provided is a method for routing signals that includes receiving a signal at one of a plurality of switch inputs of a switch, wherein the switch includes: the plurality of switch inputs, a plurality of switch outputs, a switch matrix including a plurality of N×N switching elements to selectively couple one or more of the plurality of switch inputs to one or more of the plurality of switch outputs during use to provide one or more paths for routing signals from one or more of the switch inputs to one or more of the switch outputs during use. The method also includes identifying one of the plurality of switch outputs to route the signal to, configuring one or more of the N×N switching elements of the switch matrix to provide a path for routing the signal from the switch input receiving the signal to the identified switch output; and routing the signal from the switch input to the identified switch output via the path.

In some embodiments, provided is a switch system having a plurality of switch inputs, a plurality of switch outputs, a switch matrix comprising a plurality of N×N switching elements to selectively couple one or more of the plurality of switch inputs to one or more of the plurality of switch outputs during use to provide one or more paths for routing signals from one or more of the switch inputs to one or more of the switch outputs during use.

In some embodiments, provided is a method that includes identifying a desired signal connectivity through a switch matrix, where the switch matrix includes a plurality of switching elements, and where the switching elements are selectively operable in a plurality of states to provide a plurality of signal paths for routing signals through the switch matrix. The method also includes identifying a sorting network model that corresponds to a topology of the switch matrix, applying a sorting algorithm to the sorting network model, and determining, based on the results of applying the sorting algorithm, operational states of the plurality of switching elements to provide signal paths corresponding to the desired signal connectivity.

In some embodiments, provided is a non-transitory computer readable storage medium having program instruction stored thereon, where the program instructions are executable by a computer to cause: identifying a desired signal connectivity through a switch matrix, where the switch matrix includes a plurality of switching elements, and where the switching elements are selectively operable in a plurality of states to provide a plurality of signal paths through the switch matrix. Execution of the instructions further causing identifying a sorting network model that corresponds to a topology of the switch matrix, applying a sorting algorithm to the sorting network model, and determining, based on the results of applying the sorting algorithm, operational states of the plurality of switching elements to provide signal paths corresponding to the desired signal connectivity.

In some embodiments, provided is a method that includes identifying a sorting network model having a plurality of element inputs, a plurality of comparators and a plurality of element outputs, and generating a switch matrix layout. A topology of the switch matrix layout includes a plurality of switch inputs that correspond to the plurality of element inputs of the sorting network model, a plurality of switch outputs that correspond to the plurality of element outputs of the sorting network model, and a plurality of switching elements that correspond to the plurality of comparators of the sorting network model.

In some embodiments, provided is a switch system that includes a switch matrix to route signals from one or more of a plurality of inputs to one or more of a plurality of outputs. A topology of the switch matrix includes a plurality of switch inputs that correspond to a plurality of element inputs of a sorting network model, a plurality of switch outputs that correspond to the plurality of element outputs of the sorting network model, and a plurality of switching elements that correspond to the plurality of comparators of the sorting network model.

BRIEF DESCRIPTION OF THE DRAWINGS

A better understanding of the present invention can be obtained when the following detailed description of the preferred embodiment is considered in conjunction with the following drawings, in which.

Figure 1A:
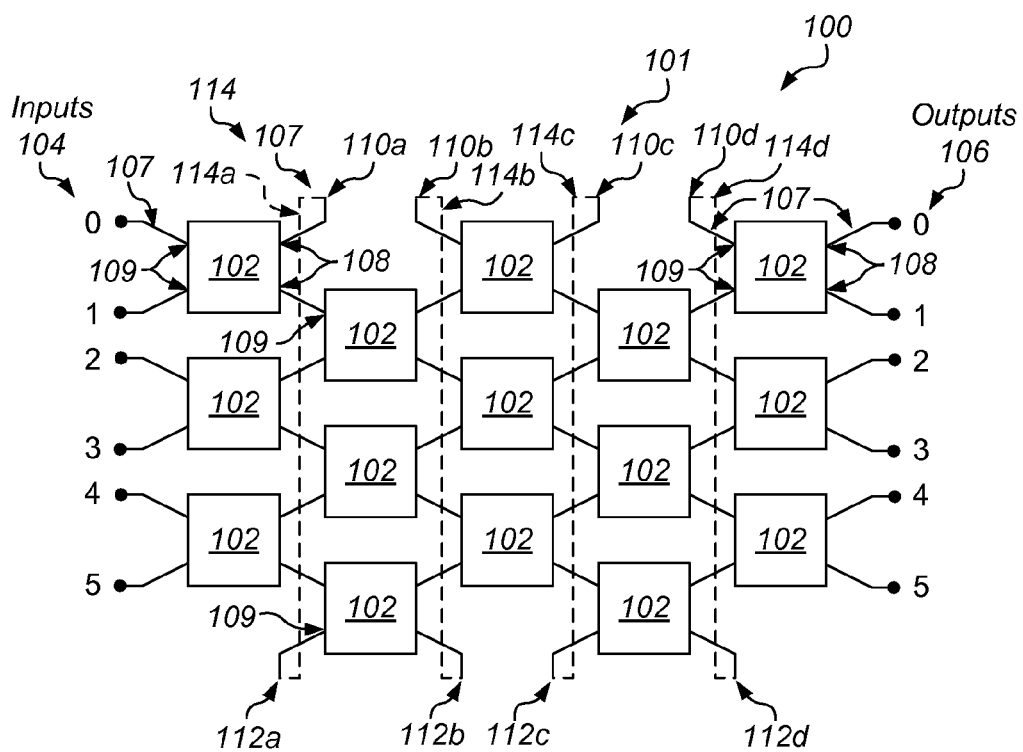
FIG. 1A is a diagram that illustrates a cylindrical matrix switch topology in accordance with one or more embodiments of the present technique.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set fourth to provide a thorough understanding of embodiments of the present invention. However, one having ordinary skill in the art should recognize that the invention may be practiced without these specific details. In some instances, well-known circuits, structures, and techniques have not been shown in detail to avoid obscuring the present invention.

This application incorporates by reference co-pending U.S. patent application entitled "SWITCH MATRIX SYSTEM AND METHOD" by Becker, et al. filed on the same day as this application, and co-pending U.S. patent application entitled "SWITCH MATRIX MODELING SYSTEM AND METHOD" by Becker, et al. filed on the same day as this application.

As discussed in more detail below, certain embodiments include systems and methods relating to switches, and more particularly to topologies for switches. In some embodiments, a switch topology is suited for use with routing radio-frequency (RF) signals. In certain embodiments, a switch topology employs one or more 2×2 switching elements. In some embodiments, the 2×2 switching elements provide for an effectively "stub-less" RF matrix switch, thereby helping to reduce capacitive loads that may otherwise create interference (e.g., reflections) that could degrades the RF signal being routed through the switch. In some embodiments, a switch topology is modeled or otherwise associated with a corresponding sorting network topology. In certain embodiments, a switch matrix design/layout is determined and implemented based on a corresponding sorting network topology. In some embodiments, routing through a switch matrix is determined based on corresponding sorting network topology. In certain embodiments, a switch matrix includes 2×2 switching elements that corresponding to comparators of a sorting network. In some embodiments, some or all of the switching elements of the switch matrix include a 2×2 switching element. In some embodiments, the 2×2 switching elements include reduced "stubs" or "dead ends" to reduce capacitive loads, thereby reducing reflections and interference (e.g., reflections) to inhibit degradation of signals routed through the switch. In certain embodiments, the switching elements include a single 2-Form-C relay, two 1-Form-C relays, and/or a 2×2 multiplexer (Mux-Mux) switch. In some embodiments, two 1-Form-C relays may be disposed in close relation to one another and/or on opposite sides of a printed wiring board (PWB) or printed circuit board (PCB) to form a 2×2 switching element. In certain embodiments, various switch matrix topologies are provided, including, but not limited to, cylindrical topologies, J-type topologies, reconfigurable topologies, multiplexer-matrix-multiplexer (Mux-Mat-Mux) topologies. In some embodiments, other types and configurations switching elements may be employed, such as other multi-dimensional switching elements (e.g., 4×4 and 8×8 switching elements). In certain embodiments, multiple paths (e.g., 2-wires) are routed in a substantially identical manner through a switch matrix. In certain embodiments, multi-dimensional switching elements are used to route pairs or set of signals (e.g., differential signals) in parallel. Such switching elements may be referred to as multi-wire switching elements, as multiple paths/wires are routed in parallel in substantially the same manner. For example, a pair of inputs may be routed to a corresponding pair or outputs, while another pair of inputs is routed to a corresponding other pair of outputs.

FIG. 1A is a diagram that illustrates a cylindrical matrix switch topology 100 in accordance with one or more embodiments of the present technique. Cylindrical matrix switch topology 100, as well as other switch topologies described herein, may be representative of the topology of a switch used to provide a connection between a plurality of inputs and outputs. The inputs and outputs may include, for example, physical input/output (I/O) pins of a configurable switching module, such as those described below with respect to FIG. 16. In some embodiments, cylindrical matrix switch topology 100 includes a cylindrical switch matrix ("switch matrix") 101 including a plurality of switching elements 102 that may be selectively operated to connect (e.g., electrically couple) inputs 104 and outputs 106. For example, in the illustrated embodiment, topology 100 includes a 6×6 cylindrical matrix topology including six inputs 104 (0-5) and six outputs 106 (0-5). Any of inputs 104 may be connected to any of outputs 106 via switching elements 102. Each one of inputs 104 may be selectively connected to one of outputs 106. In some embodiments, at any given time, each of inputs 104 is connected to different ones of outputs 106 such that no two inputs are connected to the sme output. Matrix 101 may include the same number of inputs and outputs. Although matrix 100 may be illustrated as a 6×6 matrix in an attempt to simplify the discussion provided herein, it will be appreciated that cylindrical switch topology 100 may include larger or smaller matrices (e.g., 9×9, 8×8, 4×4, etc.) having various number of inputs and outputs.

In some embodiments, inputs 104 and outputs 106 may provide for the routing of signals into and out of switch matrix 101. For example, in the illustrated embodiment, an input 104 may provide a path for an input signal to be provided into switch matrix 101, the signal may be routed via switching matrix 101 such that the routed signal exits switch matrix 101 via an output 106.

In some embodiments, switching elements may include multi-dimensional switching elements. For example, each of the switching elements may include a 2×2 switching elements, 4×4 switching elements, 8×8 switching elements, and so forth. In the illustrated embodiment, each of switching elements 102 includes a 2×2 switching element. For example, each of switching elements 102 includes two inputs (e.g., input terminals) and two outputs (e.g., output terminals). As described below with respect to at least FIGS. 14 and 15, pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing).

Switching element 102 may be operable between two different states to provide for the routing of signals through the switching element in one of two ways. In first switching state, switching element 102 may route a first input to a first output, and a second input to a second output. In second switching state, switching element 102 may route the first input to the second output, and the second input to the first output. That is, switching element 102 may selectively route signals directly (e.g., "straight-through") to two corresponding outputs, or may route the signal such that the signals trade (e.g., "swap") paths such that the swapped signals are output on the other of the two outputs. Thus, at each 2×2 switching element 102, a signal may proceed straight through, or it may trade/swap places with its neighbor, thereby enabling the signal to wind its way through switch matrix 101 from one of inputs 104 to one of outputs 106. As discussed in more detail below, although the paths are discussed with regard to inputs and outputs to provide clarity and consistency with regard to input/output (I/O) paths/terminals labeled as inputs (e.g., inputs 104) and outputs (e.g., outputs 106), in some embodiments, the resulting conductive path may be used to route signals in either direction (e.g., from outputs to inputs of from inputs to outputs).

In some embodiments, each of switching elements 102 is coupled to another of switching elements 102 via interconnects 107. Interconnects 107 may include conductive path that provides for the routing of an electrical signal between to elements/components. For example, interconnects 107 may include a conductive (e.g., metal) trace located on a printed circuit board (PCB). As depicted interconnects 107 may couple an output 108 (e.g., output terminal) of one of switching elements 102 to an input 109 (e.g., input terminal) of another one of switching elements 102. Interconnects may also be provided to couple inputs 104 to inputs 109 of switching elements 102 and/or outputs 106 to outputs 108 of switching elements 102.

In some embodiments, switch matrix 101 may include interconnects 107 that seamlessly wrap the matrix back onto itself. All of the inputs and outputs of the each of the switching elements may be coupled to an input 104, an output 106, or other corresponding outputs or inputs of other switching elements. For example, as depicted in the illustrated embodiment, each interconnect 107 extending from switching elements 102 located at a top edge/row of switch matrix 101 includes a portion 110a-110e that may be coupled to a complementary portion 112a-112e of switching elements 102 located at a bottom edge/row of switch matrix 101 (e.g., located on an edge of switch matrix 101 that is physically opposite from the top row). Each of portions 110a-110e may be coupled to corresponding portions 112a-112e, respectively, via wrapping interconnects 114 extending there between. For example, in the illustrated embodiment, portion 110a is coupled to portion 112a via wrapping interconnect portion 114a. As depicted, similar wrapping interconnect portions 114b-114d may be provided for connecting each of portions 110b-110e to portions 112b-112e, respectively.

Traces/paths for interconnects 107 and/or wrapping interconnect portions may be routed in any manner to avoid collision/shorting/blocking of the traces/paths with one another. In some embodiments, wrapping interconnect portions (e.g., portion 114a) may include a trace that is provided in a plane of a printed circuit board (PCB) other than the plane containing interconnects 107. For example, wrapping interconnect portions may be located on a back side/face of, or in one or more internal layers of, a PCB having switch matrix 101 interconnects 107 and/or switching elements 102 disposed on the front side/face of the PCB. Similarly, where interconnects 107 are disposed in layer of the PCB, interconnect portions may be located on a back or front side/face or in one or more other internal layers of the PCB.

Switch matrix 101 may have a topology such that it may be physically laid out on a cylindrical/tubular shaped PCB such that the top row and bottom row of switching elements 102 are adjacent one another (e.g., at a seam running along the cylinder) and are coupled to one another using interconnects having paths similar to that for switching elements 102 located in a central region of switch matrix 101. That is the cylindrical topology of switch matrix 101 may enable the switch matrix 101 to take the physical shape of a cylinder such that portions 110a-110d directly coupled to one another (such that wrapping interconnects (e.g., 114a-114d) are not required). Inputs 104 and outputs 106 may be located at opposite ends of the cylinder.

Switch matrix 101 may include enough switching elements such that any input can be routed to any output. In the illustrated embodiment, the 6×6 switch matrix 101 includes fifteen 2×2 switching elements. In some embodiments, each of the 2×2 switching elements may include a single 2-Form-C relay, or two 1-Form-C relays, for a total of fifteen 2-Form-C relays or thirty 1-Form-C relays. It is noted that a conventional 6×6 cross-point matrix (often employed for RF switching) may require seventy 1-Form-C relays. Accordingly, switch matrix 101 may significantly reduce the number of relays (e.g., the cost of relays) by about 50% or more. A 4×4 cylindrical switch matrix 101 may include six 2×2 switching elements, and an 8×8 cylindrical switch matrix 101 may include twenty-eight 2×2 switching elements. In some embodiments, switching elements 102 may include various forms, such as the 2×2 switching elements depicted and described herein with respect to at least FIGS. 8-12B.

In some embodiments, a minimum number of switching elements may be provided to enable any input to be routed to any output. In some instances, however, a blocking condition may occur such that two path conflict with one another, thereby not allowing a particular one or more of the inputs to a particular one or more of the outputs simultaneously. In some embodiments, additional switching elements (e.g., more than the minimum number of switching elements to enable any input to be routed to any output) may be provided to reduce or eliminate the likelihood of a blocking condition occurring. Thus, such additional switching elements may ensure that signals can be routed from any input to any output destination simultaneously. For example, with the use of additional switching elements, multiple/redundant pathways may exist between a given input and a given output such that the signal can be routed on a redundant pathway in the instance where one of the possible pathways is blocked (e.g., used by another path connecting another of the inputs to another of the outputs). In some embodiments, a blocking condition may be created by a non-functioning switching mechanism (e.g., a relay/switching element stuck in given state/position). Thus, redundant pathways may be used to route signals around problematic or non-functioning switching mechanism.

Figure 1B:
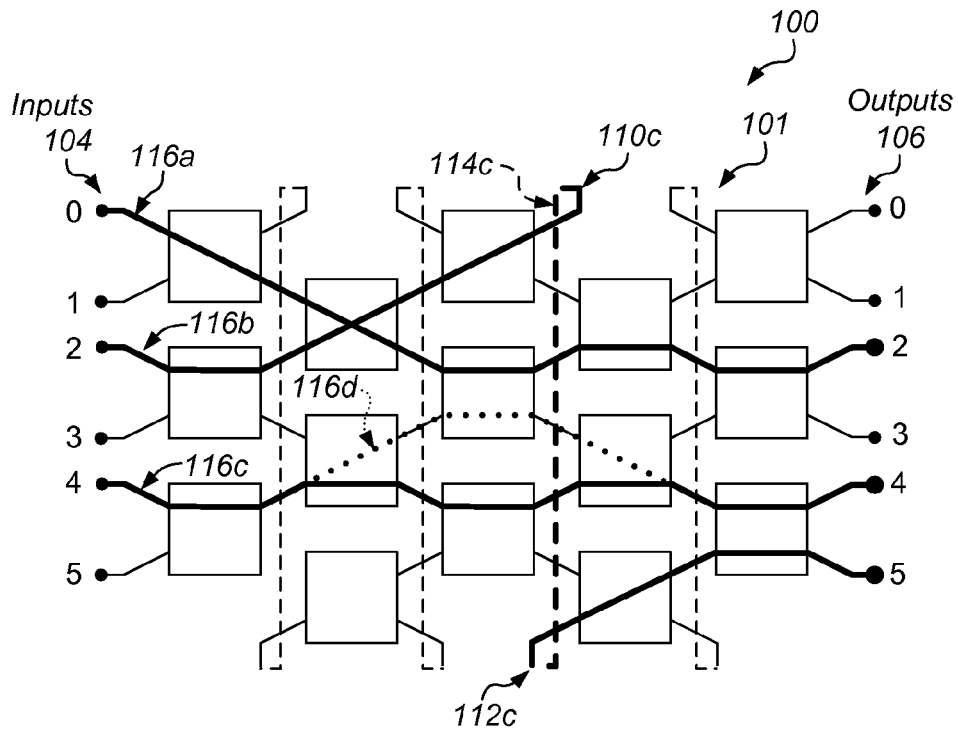
FIG. 1B is a diagram that illustrates exemplary paths through the cylindrical matrix switch topology of FIG. 1A in accordance with one or more embodiments of the present technique.

FIG. 1B is a diagram that illustrates exemplary paths through cylindrical matrix switch topology 100 in accordance with one or more embodiments of the present technique. For example, a first exemplary path 116a may connect input 0 to output 2. As depicted, the signal may be routed into switch matrix 101 from input 0, routed/swapped through a first input and a second output of each of the first two switching elements, routed straight through respective inputs and corresponding outputs of each of the third, fourth, and fifth switching elements, and exit switch matrix 101 at output 2.

A second exemplary path 116b may connect input 2 to output 4. As depicted, a signal may be routed into switch matrix 101 from input 5 on path 116b. As depicted, the signal may be routed straight through the first switching element, the signal may be routed/swapped from a second input to a first output of each of the second and third switching elements, from a first output of the third switching element to a second input of a fourth switching element via a wrapping interconnect portion 114c, routed/swapped from a second input to a first output of the fourth switching element, routed straight through the fifth switching element, and exit switch matrix 101 at output 5.

A third exemplary path 116c may connect input 4 to output 3. As depicted, a signal may be routed into switch matrix 101 from input 4 on path 116c, routed straight through each of the five switching elements, exiting switch matrix 101 at output 4.

In the illustrated embodiment, a fourth exemplary path 116d includes a path that may be redundant to path 116c. That is path 116d may enable the same input and output to be connected to one another as provided by path 116c. Exemplary path 116d may include one or more portions of the path 116c as well as one or more additional (redundant) pathway portions, as indicated by the dotted line. As depicted, a signal may be routed into switch matrix 101 from input 4 on path 116d straight through the first switching element, routed/ swapped through a second switching element, routed straight though a third switching element, routed/swapped through a fourth switching element, and routed straight through a fifth switching element, exiting switch matrix 101 at output 4. Thus, if the third switching element of path 116c were set to swap signals, as opposed to route the signal straight through, switch matrix 101 may route the signal on redundant path 116d (e.g., as opposed to path 116c) between input 4 and output 3. A similar routing may occur where the third switching element of path 116c was defective (e.g., stuck in a swapping state). Notably, the first, second, and third or fourth paths 116a, 116b, and 116c or 116d may be provided simultaneously.

Figure 1C:
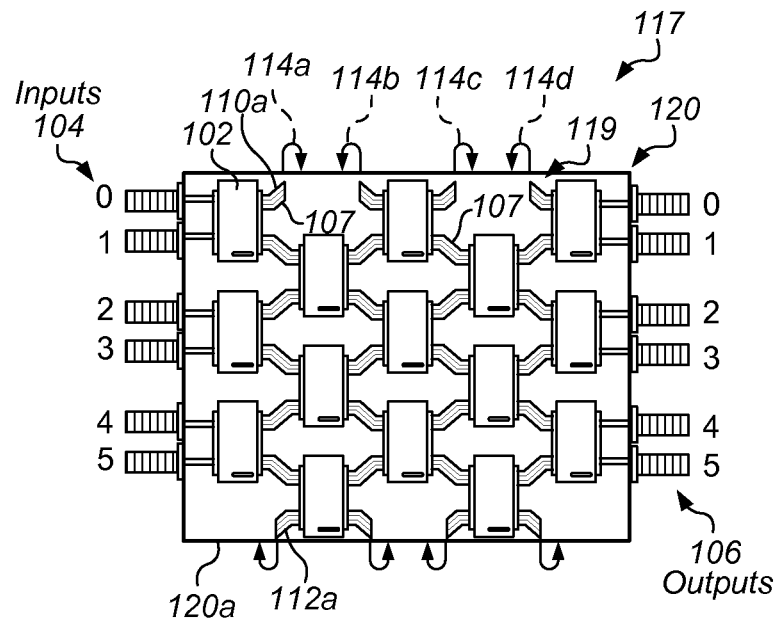
FIG. 1C is a diagram that illustrates a cylindrical matrix switch system in accordance with one or more embodiments of the present technique.

FIG. 1C is a diagram that illustrates a cylindrical matrix switch system 117 in accordance with one or more embodiments of the present technique. Cylindrical matrix switch system 117 implements a switch matrix 119 (corresponding to switch matrix 101 and topology 100) provided on a printed circuit board (PCB) 120. Switch matrix system 117 includes switching elements 102, inputs 104, outputs 106, and interconnects 107. PCB 120 may provide for mechanical support and electrically coupling electronic components using conductive pathways, tracks or traces etched from copper sheets laminated onto a non-conductive substrate, for example. In some embodiments, switching elements 102 may be coupled to PCB 120. For example, in the illustrated embodiment, switching elements 102 may be provided on a top/front surface 120a of PCB 120. Switching elements may be coupled to one another via interconnects (e.g., trace(s) and/or via(s)) 107 provided on or within layers of PCB 120 as disused above with respect to FIG. 1A. In some embodiments, switching elements 102 may be coupled to front and/or back side of PCB 120. For example, two 1-Form-C relays may be used on the same or opposite sides of PCB 120 at or near each location of switching elements 120, as depicted and described below with respect to switching element 102-102'''' of FIGS. 8-12B. In some embodiments, wrapping interconnect portions 114a-114d, similar to those described above, may be provided in a plane of a printed circuit board (PCB) other than the plane containing interconnects 107. For example, interconnect portions 114a-114d may be located on a back side/face or within one or more internal layers of PCB 120. Inputs 104 and/or outputs 106 may include micro coaxial (MCX) connectors, Bayonet Neill-Concelman (BNC) connectors, SubMiniature (SMA/SMB) connectors, or the like.

In some embodiments, all paths through switch matrix 101 and/or 119 may have substantially the same or identical electrical length and time delay. Further, switch matrix 101 may enable physical routing of signal traces on a PCB without signals crossing over one another. Thus, a PCB layout may be simplified as substantially all of the signal traces between switching elements may be provided on/in a single PCB layer, with only wrapping interconnect portions having to be provided on/in a separate PCB layer. Moreover, as described in more detail below, various 2×2 switching elements 102 may provide substantially stub-less contiguous paths (e.g., paths without conductive ends off-shooting into a dead-ends) in either states of the switching elements 102, thereby reducing stubbed paths within switch matrix 101 and providing a relatively stub-less signal path though switch matrix 101 and cylindrical matrix switch topology 100.

Additional relays may be added to switch matrix topologies described herein to provide a disconnect between one or more of inputs/outputs and the respective switch matrices depicted and described with respect to at least FIGS. 1-6. For example, additional relays may be added to provide a disconnect between one or more of inputs 104/outputs 106 and switch matrix 101 of cylindrical matrix switch topology 100. In some embodiments, at least one relay may be added to some or all of inputs 104 and outputs 106. For example, a 1-Form-C relay may be added at some or all of the nodes (0-7) of inputs 104 and nodes (0-7) of outputs 106 such that each of inputs 104 and each of outputs 106 may be electrically disconnected from switch matrix 101. The relays may be operated to selectively connect or disconnect each of inputs 104 and outputs 106 with switch matrix 101. Additional relays may be added in a similar manner to provide a disconnect between one or more of inputs 104/outputs 106 the switch matrices depicted and described with respect to at least FIGS. 2A-6.

In some embodiments, one or more redundant paths may be removed from or added to the respective switch matrices depicted and described with respect to at least FIGS. 1-6. For example, one or more switching elements may be removed from switch matrix 101 of cylindrical matrix switch topology 100 to reduce the number of redundant pathways. Removing one or more redundant paths may enable a fewer number of switching elements to be used, thereby reducing the relay cost and complexity of layout of the switch matrix. One or more switching elements may be added to switch matrix 101 of cylindrical matrix switch topology 100 to increase the number of redundant pathways. Adding one or more redundant paths may provide additional redundant paths, thereby helping to prevent blocking conditions. Switching elements may be removed/added in a similar manner to the switch matrices depicted and described with respect to at least FIGS. 2A-5. In some embodiments, a minimum number of relays may be employed to enable each of the inputs 104 to be coupled to each of the outputs 106, as described above. Where one or more redundant paths are eliminated, however, it will be appreciated that a blocking condition may be more likely to occur if two or more signals are to be routed simultaneously on separate paths.

Figure 1D:
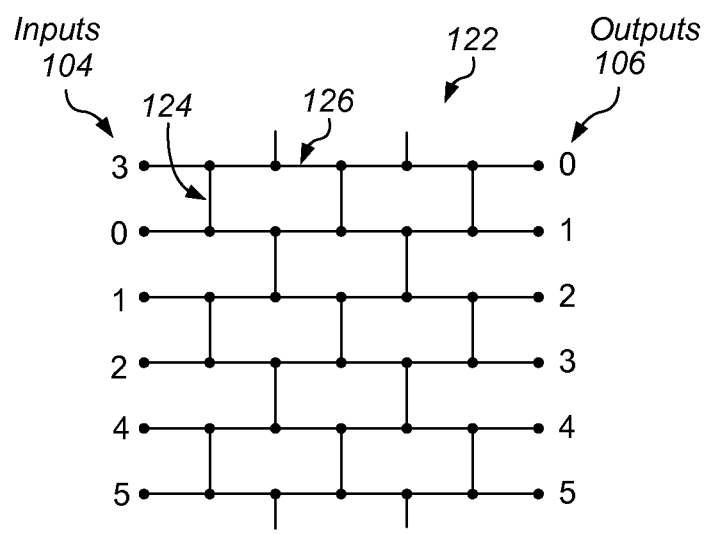
FIG. 1D is a sorting network notation model corresponding to the cylindrical switch matrix topology of FIGS. 1A-1C, in accordance with one or more embodiments of the present technique.

In some embodiments, a switch matrix topology employing 2×2 switching elements may be modeled as, or otherwise associated with, a sorting network. For example, a switch matrix may be modeled using network notation representations where the plurality of switch inputs of the modeled switch matrix correspond to numerical inputs of the sorting network, the plurality of switch outputs of the modeled switch matrix correspond to the numerical outputs of the sorting network, and the 2×2 switching elements of the modeled switch matrix correspond to comparators of the sorting network. FIG. 1D is a sorting network notation model 122 corresponding to the 6×6 cylindrical switch matrix topology 100 of FIGS. 1A-1C, in accordance with one or more embodiments of the present technique. Sorting network notation model 122 includes connectors 124 (e.g., vertical lines) corresponding to comparators of the sorting network and wires 126 (e.g., horizontal lines) corresponding to paths between the comparators. With regard to the switch matrix, connectors 124 may correspond to switching elements 102, and wires 126 may correspond to interconnects 107 (e.g., paths/traces) between the switching elements. As described in more detail below, modeling a switch matrix topology as a sorting matrix may be used to design a switch matrix layout (e.g., determine a minimum number of switching elements required and the corresponding layout of interconnects to provide for simultaneous routing of any set of inputs to any set of respective outputs). Further, using the sorting matrix model, sorting algorithms/routines may be executed to determine how paths should be routed to provide a desired connection between inputs and outputs during use (e.g., states of the comparators/connectors 124 to provide the desired sort from an input to an output may be used to provide a corresponding routing). Techniques for implementing modeling of a switch matrix with a corresponding sorting network topology are described in more detail below.

Figure 2A:
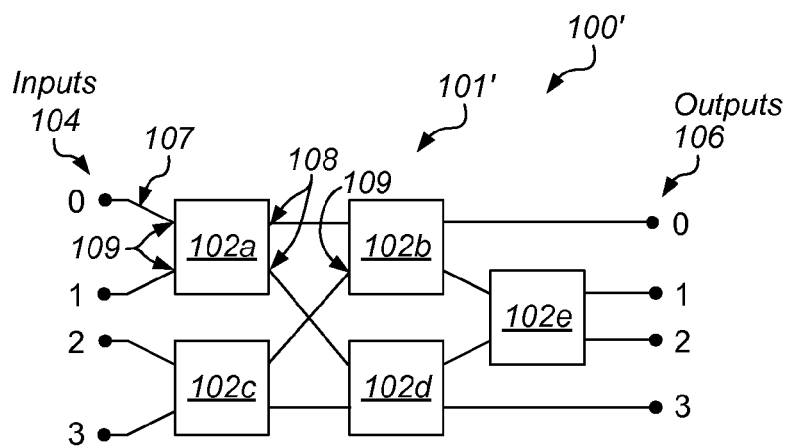
FIG. 2A is a diagram that illustrates an A-Type sorting network matrix switch topology in accordance with one or more embodiments of the present technique.

FIG. 2A is a diagram that illustrates an A-Type sorting network matrix switch topology 100' in accordance with one or more embodiments of the present technique. A-Type sorting network matrix switch topology 100' includes a switching matrix 101' including a plurality of switching elements 102 that may be selectively operated to connect inputs 104 and outputs 106. In the illustrated embodiment, topology 100' includes a 4×4 A-Type matrix switch topology including four inputs 104 (0-5) and four outputs 106 (0-5). Notably, switching elements 102 are labeled as 102a-102e to enable identification of corresponding switching elements of FIG. 2A and FIG. 2B and to clarify later discussions relating to specific routing through the switching elements in association with exemplary techniques for sorting network modeling discussed below with regard to FIG. 2C. In some embodiments, any of inputs 104 may be connected to any of outputs 106 via switching elements 102. Each one of inputs 104 may be selectively connected to one of outputs 106. In some embodiments, at any given time, each of inputs 104 is connected to different ones of outputs 106 such that no two inputs are connected to the same output. Topology 100' may include the same number of inputs and outputs. Although A-Type matrix switch topology matrix 100' is illustrated as a 4×4 matrix, A-Type matrix switch topology 100' may include any size matrices (e.g., 5×5, 6×6, 8×8, 9×9, etc.) having corresponding numbers of inputs and outputs. Other embodiments may include matrices that do not have corresponding numbers of inputs and outputs (e.g., 4×12).

Signals may be routed through a switch matrix having A-type topology 100' in a manner similar to that described with respect to cylindrical topology 100 of FIGS. 1A, 1B and 1C. For example, a signal may be routed from input 0 straight through switching elements 102a and 102b to output 0. A signal may be routed from input 1 straight through switching elements 102a and 102d, and be swapped at element 102e to output 1.

Figure 2B:
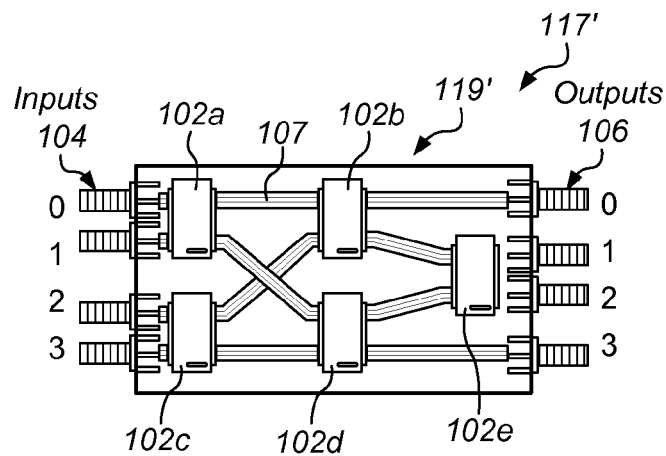
FIG. 2B is a diagram that illustrates an A-Type sorting network matrix switch system in accordance with one or more embodiments of the present technique.
Figure 2C:
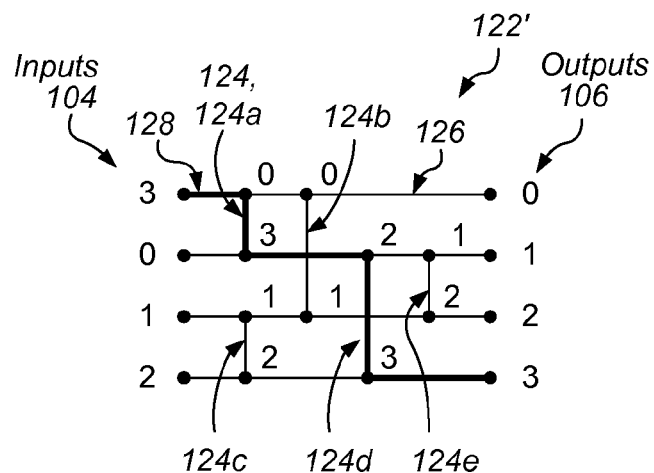
FIG. 2C is a sorting network notation model corresponding to the A-Type matrix switch topology of FIGS. 2A and 2B, in accordance with one or more embodiments of the present technique.

FIG. 2B is a diagram that illustrates a 4×4 A-Type matrix switch system 117' in accordance with one or more embodiments of the present technique. The 4×4 A-Type matrix switch system 117' implements a switch matrix 119' (corresponding to switch matrix 101') provided on a printed circuit board (PCB) 120. Switch system 117' includes switching elements 102, inputs 104, outputs 106, and interconnects 107. Switch system 117' may include features that are similar to that of switch system 117 described above. For example, interconnects may be disposed on faces or within layers of PCB 120. FIG. 2C is a sorting network notation model 122' corresponding to the 4×4 A-Type matrix switch topology 100' of FIGS. 2A and 2B, in accordance with one or more embodiments of the present technique.

In some embodiments, all paths through switch matrix 101' and/or 119' may have substantially the same or identical electrical length and time delay. As described in more detail below, various 2×2 switching elements 102 may provide substantially stub-less contiguous paths (e.g., paths without conductive ends off-shooting into a dead-ends) in either states of the switching elements 102, thereby reducing stubbed paths within switch matrix 101' and providing a relatively stub-less signal path though switch matrix 101' and topology 100'. Some or all of 2×2 switching elements 102 may be other types of switching elements, such as 4×4 switching elements, 8×8 switching elements, and so forth. As described below with respect to at least FIGS. 14 and 15, pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing).

Figure 3A:
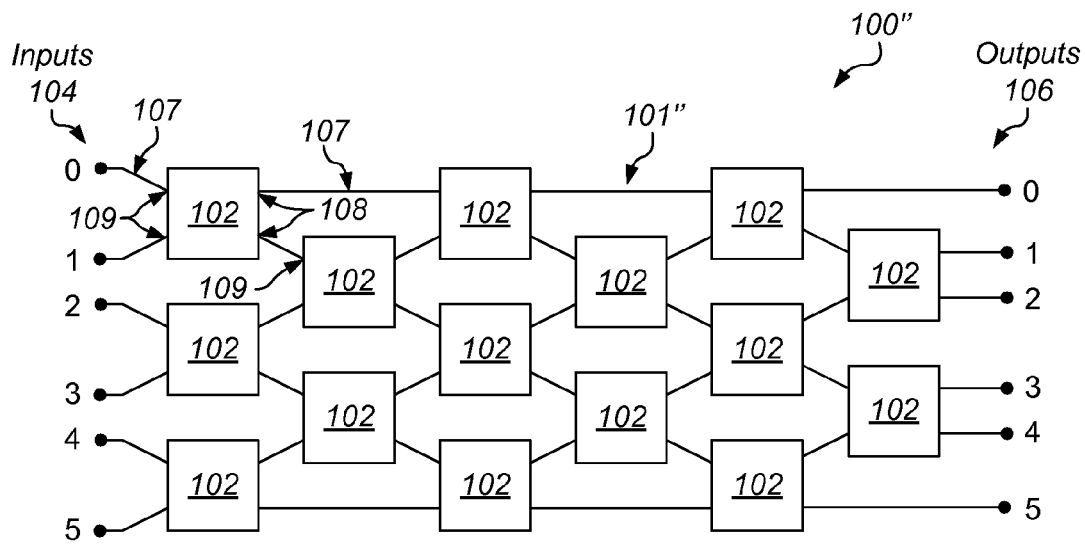
FIG. 3A is a diagram that illustrates a J-Type matrix switch topology in accordance with one or more embodiments of the present technique.

FIG. 3A is a diagram that illustrates a J-Type matrix switch topology 100" in accordance with one or more embodiments of the present technique. J-Type matrix switch topology 100" includes a switching matrix 101" including a plurality of switching elements 102 that may be selectively operated to connect inputs 104 and outputs 106. In the illustrated embodiment, topology 100" includes a 6×6 J-Type matrix switch topology including six inputs 104 (0-5) and six outputs 106 (0-5). J-Type matrix switch topology 100" may be similar to that of cylindrical switch topology 100 absent wrapping interconnects between the upper and lower rows of switching elements. Interconnects 107 may extend from the respective inputs and outputs of adjacent one of the switching elements on the upper and lower rows of switching elements. Relays previously provided for in certain location of topology 100 (e.g., the two relays of the bottom row of FIG. 1A), may be moved to other locations within topology 100" (e.g., two relays located in the right column of FIG. 3A) to provide desired signal connectivity/routing. Such a design may reduce complexity of the switch layout. Notably, switching elements 102 may be provided between adjacent switching elements, such that none of the interconnects there between cross-over one another. For example, topology 100" without cross-over of interconnects may be compared to topology 100' of FIGS. 2A and 2B that includes an interconnect between switching elements 102*a* and 102*d* crossing over interconnect between switching elements 102*b* and 102*c*. In some embodiments, any of inputs 104 may be connected to any of outputs 106 via switching elements 102. Each one of inputs 104 may be selectively connected to one of outputs 106. In some embodiments, at any given time, each of inputs 104 is connected to different ones of outputs 106 such that no two inputs are connected to the same output. Topology 100" may include the same number of inputs and outputs. Although J-Type matrix switch topology matrix 100" is illustrated as a 6×6 matrix, J-Type matrix switch topology 100" may include any size matrices (e.g., 4×4, 5×5, 8×8, 9×9, etc.) having corresponding numbers of inputs and outputs.

Signals may be routed through a switch matrix having J-type matrix switch topology 100" in a manner similar to that described with respect to topologies 100 and 100' and FIG. 1B. For example, a signal may be routed from input 0 straight through three switching elements 102 to output 0. A signal may be routed from input 1 straight through five switching elements 102, and be swapped at the sixth switching element 102 to output 2.

Figure 3B:
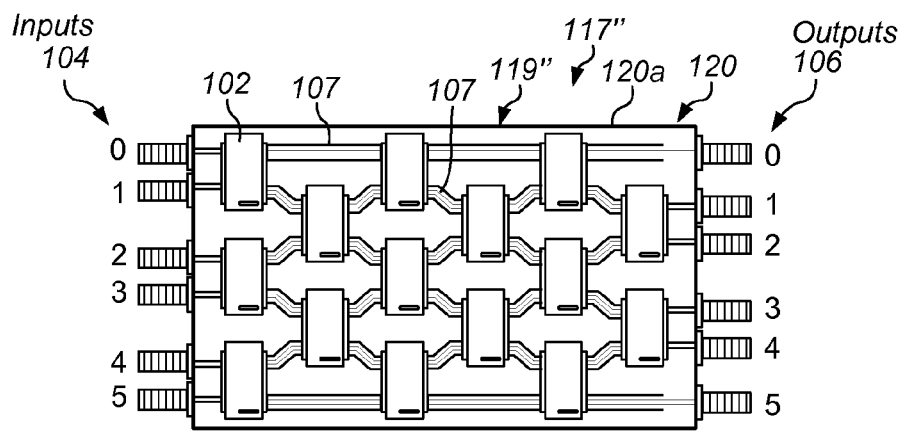
FIG. 3B is a diagram that illustrates a J-Type matrix switch system in accordance with one or more embodiments of the present technique.
Figure 3C:
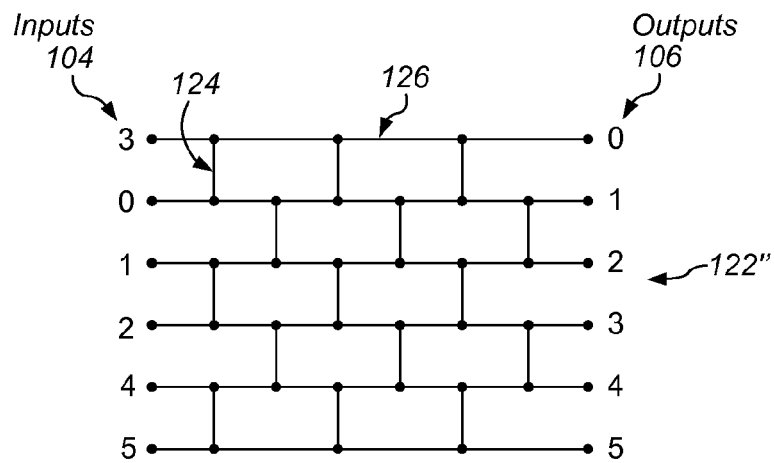
FIG. 3C is a sorting network notation model corresponding to the J-Type matrix switch topology of FIGS. 3A and 3B, in accordance with one or more embodiments of the present technique.

FIG. 3B is a diagram that illustrates a 6×6 J-Type matrix switch system 117" in accordance with one or more embodiments of the present technique. The 6×6 J-Type matrix switch system 117" implements a switch matrix 119" (corresponding to switch matrix 101") provided on a printed circuit board (PCB) 120. Switch system 117" includes switching elements 102, inputs 104, outputs 106, and interconnects 107. Switch system 117" may include features that are similar to that of switch system 117 described above. For example, interconnects may be disposed on faces or within layers of PCB 120. FIG. 3C is a sorting network notation model 122" corresponding to the 6×6 J-Type matrix switch topology 100" of FIGS. 3A and 3B, in accordance with one or more embodiments of the present technique.

In some embodiments, all paths through switch matrix 101" and/or 119" may have substantially the same or identical electrical length and time delay. As described in more detail below, various 2×2 switching elements 102 may provide substantially stub-less contiguous paths (e.g., paths without conductive ends off-shooting into a dead-ends) in either states of the switching elements 102, thereby reducing stubbed paths within switch matrix 101" and providing a relatively stub-less signal path though switch matrix 101" and topology 100". Some or all of 2×2 switching elements 102 may be other types of switching elements, such as 4×4 switching elements, 8×8 switching elements, and so forth. As described below with respect to at least FIGS. 14 and 15, pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing).

Figure 4:
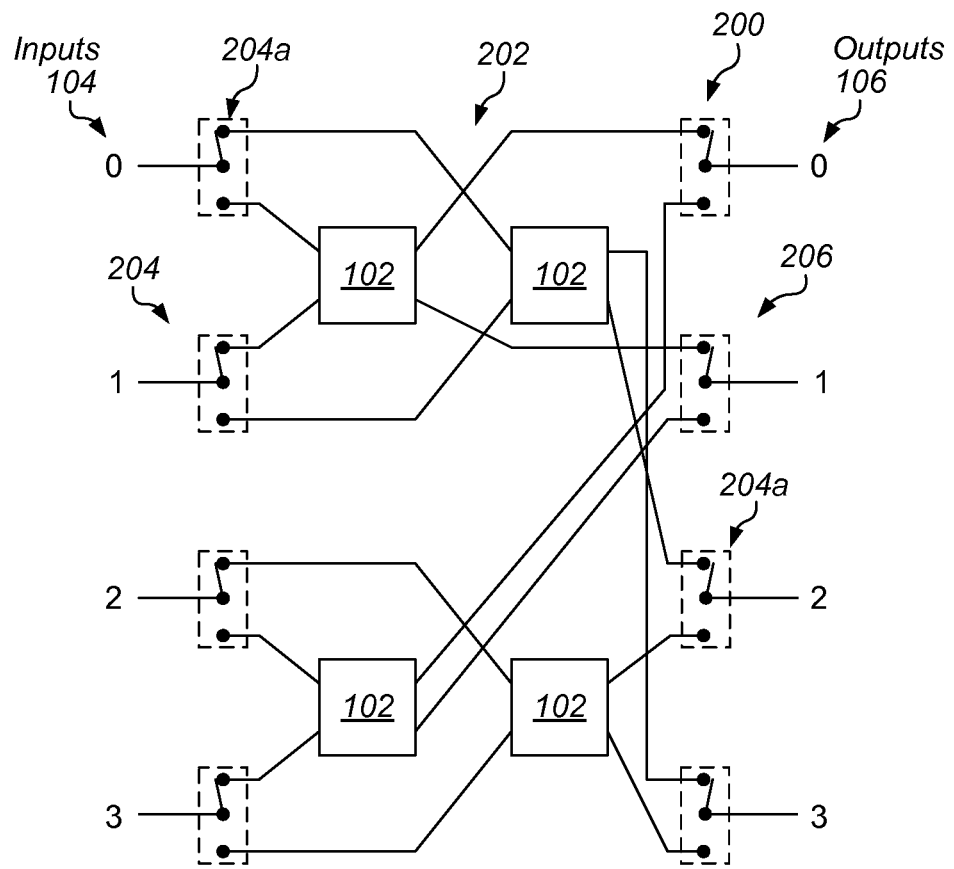
FIG. 4 is a schematic diagram that illustrates a multiplexer-matrix-multiplexer (Mux-Mat-Mux) switch topology in accordance with one or more embodiments of the present technique.

FIG. 4 is a schematic diagram that illustrates a multiplexer-matrix-multiplexer (Mux-Mat-Mux) switch topology 200 in accordance with one or more embodiments of the present technique. In the illustrated embodiment, Mux-Mat-Mux switch topology 200 includes a 4×4 switch matrix that includes a first set of multiplexers 204 coupled to of inputs 104, a second set of multiplexers 206 coupled to outputs 106, and matrix 202 including four 2×2 switching elements 102. In some embodiments, each path includes a unique pathway. That is, there may only be one possible path to route a signal from a given input to a given output. For example, a signal routed from input 0 to output 2 may be routed though multiplexer 204*a* to the upper node as depicted, to a first input of a switching element 102 coupled to the upper node, the signal may be routed to a second output of given switching element 102 (e.g., swapped), and routed to output 2 via the upper node of multiplexer 206*a*, as depicted. Similar unique pathways may be provided for each combination of inputs 104 (0-3) and outputs 106 (0-3).

Other embodiments may include other size matrices, including, for example, a 6×6 switch matrix, a 4×8 rectangular switch matrix, a 4×16 rectangular switch matrix, or the like. Although depicted matrix 302 includes a 4×4 set of switching elements 102, matrix 202 may include other numbers of switching elements to provide desired signal connectivity/routing. For example, matrix 202 may include an 8×8 set of switching elements 102. Although depicted multiplexers 204 include 1×2 multiplexers, any size multiplexer may be used to provide desired signal connectivity/routing. Some or all of 2×2 switching elements 102 may be other types of switching elements, such as 4×4 switching elements, 8×8 switching elements, and so forth. As described below with respect to at least FIGS. 14 and 15, pairs/sets of signals may be routed in a substantially similar manner by employing, at each of the switching element locations 102, larger dimension switching elements (e.g., 4×4 and 8×8) and/or multiple 2×2 switching elements to effectively provide functionality of larger dimensioned switching elements (e.g., multi-wire signal routing).

In some embodiments, a switch matrix topology and/or a switch system employing 2×2 switching elements may be modeled as a sorting matrix/network. For example, a switch matrix may be modeled using network notation representations. A switch matrix topology may be modeled based on of a sorting network layout during design of a switch to determine a minimum number of switching elements required and the corresponding layout of interconnects to provide for desired switch routing. For example, a switch modeled after a sorting network may provide paths for the simultaneous routing of any set of inputs to any set of respective outputs. Further, using the sorting matrix model, sorting algorithms/routines may be executed to determine how paths should be routed to provide a desired connection between inputs and outputs during use.

As discussed above, FIG. 2C is a sorting network notation model 122' in accordance with one or more embodiments of the present technique. Sorting network notation model 122' includes connectors 124 (e.g., vertical lines), each corresponding to a two-input sorting element (e.g., a comparator) of the sorting network, and wires 126 (e.g., horizontal lines) corresponding to paths between the comparators. The wires terminate into input terminals for providing/inputting an "unsorted" listing of sortable elements and terminate on opposite ends into output terminals for providing/outputting a "sorted" listing of the sortable elements. Sorting may occur upon the application of a sorting algorithm that corresponds to the network sorting model. The two-input sorting element or comparator may provide a compare-exchange operation with respect to the two inputs received thereby. With regard to a switch matrix implementing 2×2 switching elements, connectors 124 may correspond to switching elements 102, and wires 126 may correspond to interconnects 107 (e.g., paths/traces) between the 2×2 switching elements. Sorting network notation model 122' may correspond to the 4×4 switch matrix topology 100' of FIG. 2A and matrix switch system 117' of FIG. 2B. For example, in the illustrated embodiment, each connector (vertical edges 124a-124e) represents a respective one of switching elements 102a-102e). Note, the wires (horizontal lines/edges) of model 122' do not necessarily correspond to a continuous trace/interconnect on PCB 102 of matrix switch system 117'. In some embodiments, network sorting techniques, modeling of a switch using sorting network notation, and operations relating thereto may be provided via a network sorting module provided on a computer, such as computer system 1000 discussed below.

When implemented, the sorting network may sort storable elements provided at inputs to a sequential order (e.g., ascending or descending order) provided at the outputs. For example, by network sorting convention, each element may sort the outputs to a sequential order (e.g., ascending order with the largest number going to the bottom), as represented by outputs 106 listed as 0, 1, 2, and 3 from top to bottom of model 122'. Inputs 104 may include an arbitrary set of channel numbers, as represented by inputs 104 labeled as 3, 0, 1, and 2 from top to bottom of model 122', indicating the destination for each respective input. For example, the first/top input (labeled 3) is to be routed to output 3, the second input (labeled as 0) is to be routed to output 0, the third input (labeled as 1) is to be routed to output 1 and the fourth input (labeled as 2) is to be routed to output 2. The numbers listed at the ends of each vertical edge are indicative of how an element to be sorted (e.g. a number) theoretically winds its way through the sorting network from an input to an output. Notably, the path through the sorting network may resemble the path of a signal as it passes through a switch having traces and 2×2 switching elements that correspond to the lines and connectors of the sorting network model.

Based on the ability to track the path of an input element (e.g., number) from an input to a sorted output, sorting may be used to determine a state of each comparator, and thus the state of each 2×2 switching element of the corresponding to switch matrix topology to achieve a routing of signals that follows the same path as the routing of elements being sorted. For example, where a user desires to route the first input to the last/fourth output (labeled 3), the user may associate the number "3" with (e.g., place the number "3" at) the first input along with the numbers "0", "1" and "2" at the other inputs, knowing that the sorting network will generate a path from the first input to the last/fourth output. That is, where a user desires to route a signal from a given input to a given output, the user may simply provide a sortable element (e.g., a number, letter, symbol, etc.) indicative of the last output at the given input of the network sorting model, and implement a sorting routine which will direct the element to the desired output and observe the path of the element through the sorting network model from the input to the output. The observed path corresponds to a signal path through the switch matrix. Thus, where the path crosses through a connector, the switching element corresponding to the connector may be provided in the swapped state, and where the path does not cross through the connector, the switching element corresponding to the connector may be provided in a pass-through/unswapped state such that the signal is not swapped at that respective switching element.

As observed with regard to the bolded element path 128 in model 122' of FIG. 2C, the element labeled as 3 is input to a first line 126 (as indicated by the input label "3"), crosses through connector 124a to a second line 124 (as indicated by swapped positions of "0" and "3" at nodes of connector 124a), is directed on second line 124a to connector 124d, crosses through connector 124d to a forth line 126 (as indicated by swapped positions of "2" and "3" at nodes of connector 124d) and is directed to the last output (as indicated by the output label "3"). Based on the sorting and the path for element "3", switching element 102a (corresponding to connector 124a) may be operated in a state to swap signals and switching element 102d (corresponding to connector 124d) may be operated in a state to swap signals. As depicted similar sorting may be provides for each element input to the sorting network model 122', thereby providing observable paths between each of the inputs and the outputs corresponding to the elements provided at each input. Thus, the state of each of the 2×2 switching elements may be determined based on the states of the corresponding connectors of the sorting network model observed as a result of the sort. For example, switching element 102b may be operated to pass signals straight-through (as indicated by the non-swapped positions of "0" and "1" at nodes of connector 124b), switching element 102c may be operated to pass signals straight through (as indicated by the non-swapped positions of "1" and "2" at nodes of connector 124c), and switching element 102e may be operated to swap signals (as indicated by the swapped positions of "1" and "2" at nodes of connector 124e). With the switching elements of switching topology 100' and switch system 117' set to these states, signals may be routed such that input 0 is connected to output 3, input 1 is connected to output 0, input 2 is connected to output 1, and input 3 is connected to output 2. Thus, a routing technique includes providing/identifying a sorting network model that corresponds to the layout of a switch matrix, providing—for each input—an indication of a desired output location, implement a sorting routine using the sorting network model, identifying/determining the resulting conditions of the connectors/comparators of the sorting network, and configuring the switching elements of the switch matrix into states that correspond to the identified/determined conditions of the connectors/comparators.

Figure 5:
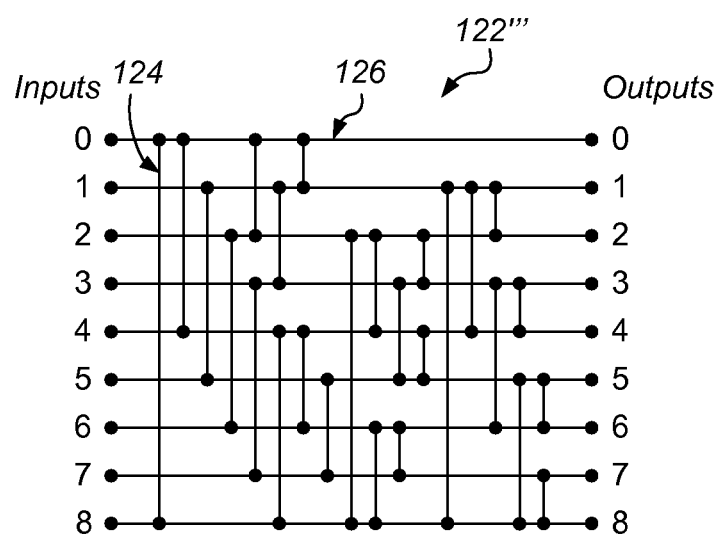
FIG. 5 is a network notation model of a 9×9 switch matrix topology in accordance with one or more embodiments of the present technique.

Although the above embodiments relate to a network model of a 4×4 matrix and techniques related thereto, other embodiments may include matrices of various sizes and configurations. For example, similar techniques may be employed for various sizes of switches having cylindrical matrix topologies and J-type matrix switch topologies, such as those described with respect to FIGS. 1A-1D and 3A-C. Further, various forms of network sorting models may be used to design switch topologies. For example, FIG. 5 is a network notation model 122''' of a 9×9 switch matrix topology in accordance with one or more embodiments of the present technique. In some embodiments, a matrix switch may be designed and implemented that includes corresponding inputs and outputs coupled via interconnects and 2×2 switching elements that correspond to each of the depicted connectors 124. Embodiments may employ any form of sortable element (e.g., a number, letter, symbol, etc.) that can be sorted in a predictable order (e.g., an ascending or descending order). Other embodiments may include implementing models and methods provided by various network sorting techniques. For example, a switch may correspond to network sorting topologies including, but not limited to, Bose-Nelson sort, Hibbard sort, Batcher sort, END sort, Insertion sort, Bitonic sort, Odd-Even Merge sort, Shell sort, Transposition Sort, Pairwise sort, Bubble sort, Selection sort, or any combination thereof.

Table 1 provides a relay count (No. 1-Form-C relays required) by size (No. Inputs) for a switch matrix design using a network notation model. For example, a 13×13 matrix may require ninety 1-Form-C relays according to network notation modeling.

TABLE 1

| | No. Inputs | | | | | | | | | | | | | | |
|---|---|---|---|---|---|---|---|---|---|---|---|---|---|---|---|
| | 2 | 3 | 4 | 5 | 6 | 7 | 8 | 9 | 10 | 11 | 12 | 13 | 14 | 15 | 16 |
| No. 1-Form-C Relays | 2 | 6 | 10 | 18 | 24 | 32 | 38 | 50 | 58 | 70 | 78 | 90 | 102 | 112 | 120 |
| No. Contacts in Series | 1 | 3 | 3 | 5 | 5 | 6 | 6 | 7 | 7 | 8 | 8 | 9 | 9 | 9 | 9 |

Switching elements the same or similar to those described above may be employed in a variety of schemes to provide for routing of signals. In some embodiments, for example, 2×2 switching elements may be employed in conjunction with multiplexers to provide a switch having desired signal connectivity/routing.

Figure 6:
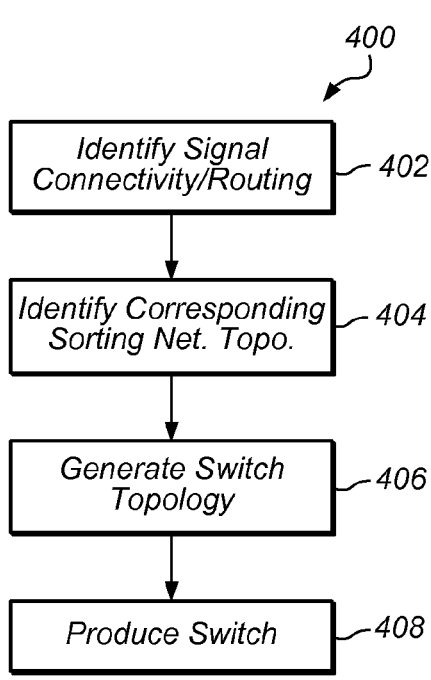
FIG. 6 is a flowchart that illustrates a method of designing and/or manufacturing a switch matrix in accordance with one or more embodiments of the present technique.

FIG. 6 is a flowchart that illustrates a method 400 of designing and/or manufacturing a switch matrix in accordance with one or more embodiments of the present technique. Method 400 generally includes identifying signal routing, identifying a sorting network topology that corresponds to the identified signal routing, generating a switch matrix topology that corresponds to the identified network topology, and producing a switch that includes the layout of the switch matrix topology. Method 400 may be employed using a computer system. For example, at least processing relating to the identifying a corresponding sorting network topology, generating switch topology, and/or producing a switch may be provided via an application executed on a computer system, such as computer system 100 described below. It will be appreciated that method 400 is intended to be exemplary, and is not intended to limit that scope of the techniques described herein. Method steps may be added, repeated, eliminated, rearranged, and so forth. Method 400 may be employed with various topologies, including those having 2×2 and/or other types of switching elements, as described herein.

Method 400 may include identifying signal routing, as depicted at block 402. In some embodiments, identifying signal routing may include identifying the desired number of inputs and outputs, whether the switch needs to be configurable to connect every input to every output, the desire to use a minimum number of relays, the desire to reduce the risk of blocking conditions (e.g., provide for redundancy) and so forth. For example, a user may determine the need for a 4×4 matrix switch (e.g., a switch having four inputs and four outputs) that enables each of the inputs to be connected to any one of the outputs simultaneously in any combination.

Method 400 may include identifying a sorting network topology that corresponds to the identified signal routing, as depicted at block 404. In some embodiments, identifying the sorting network topology may include identifying a topology that includes the desired number of inputs and outputs, and provides the desired connectivity. For example, where a 4×4 matrix switch is desired, a corresponding four-element sorting network and its model (e.g., the sorting network model 122' of FIG. 2C) may be identified. The identified sorting network may include comparators/connectors that correspond to the 2×2 switching elements of a layout of the desired/identified switch topology.

Method 400 may include generating a switch topology, as depicted at block 406. In some embodiments, generating a switch topology may include identifying a switch topology that includes 2×2 switching elements that correspond to the sorting elements/comparators provided in the identified sorting network topology. For example, where the four-element sorting network model 122' of FIG. 2C is identified, a corresponding switch topology (e.g., topology 100' of FIG. 2A) may be generated or otherwise provided. In some embodiments, the switch topology may be modified. For example, one or more inputs, outputs, or switching elements may be removed, potentially reducing complexity and cost. Further, one or more inputs, outputs, or switching elements may be added, potentially improving performance (e.g., providing redundancy and reducing the likelihood of blocking conditions). In some embodiments, additional relays may be provided (e.g., at the inputs and/or outputs) to provide for complete disconnect of certain paths.

Method 400 may include producing a switch, as depicted at block 408. In some embodiments, producing a switch includes producing at least a portion of the switch topology derived from the identified sorting network topology. Producing the switch may include providing the finalized design of the switch, manufacturing components of the switch, and/or manufacturing a switch system employing at least a portion of the switch topology derived from the identified sorting network topology.

Figure 7:
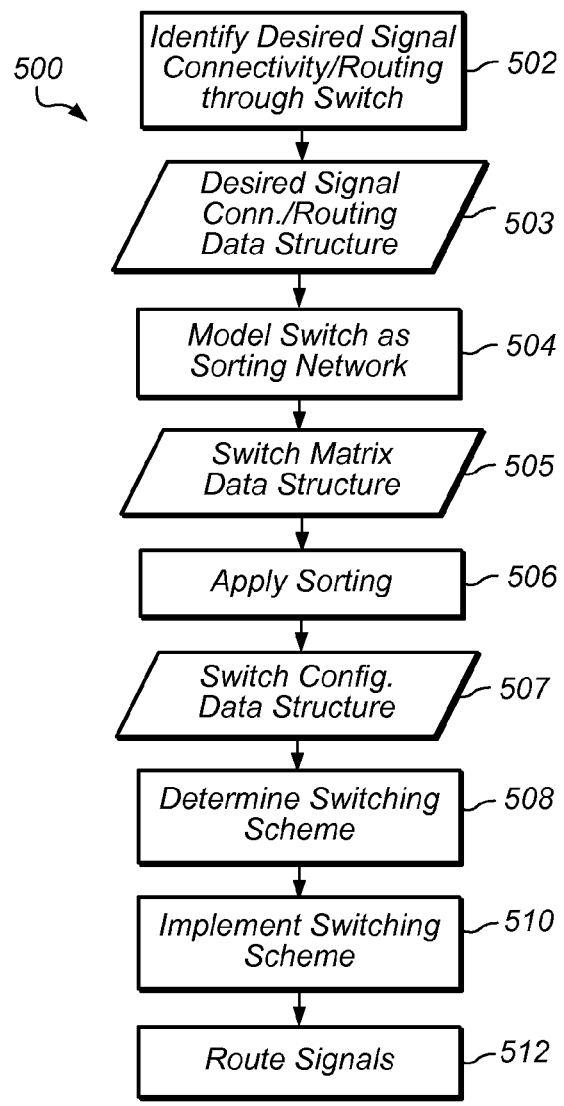
FIG. 7 is a flowchart that illustrates a method of employing a switch matrix in accordance with one or more embodiments of the present technique.

FIG. 7 is a flowchart that illustrates a method 500 of employing a switch matrix in accordance with one or more embodiments of the present technique. Method 500 generally includes identifying a desired signal connectivity/routing through a switch, modeling the switch as a sorting network, applying sorting to the model, determining a switching scheme based on the applied sorting, implement the switching scheme, and routing the signals accordingly. Method 500 may be employed using a computer system. For example, at least processing relating to applying sorting, determining and/or implementing a switching scheme may be provided via an application executed on a computer system, such as computer system 1000 described below. It will be appreciated that method 500 is intended to be exemplary, and is not intended to limit that scope of the techniques described herein. Method steps may be added, repeated, eliminated, rearranged, and so forth. Method 500 may be employed with various topologies, including those having 2×2 and/or other types of switching elements, as described herein.

Method 500 may include identifying a desired signal connectivity/routing through a switch, as depicted at block 502.

Identifying a desired signal connectivity/routing may include identifying one or more inputs, outputs, or ports between which a signal is to be routed. For example, with regard to FIGS. 2A and 2B, it may be determined that a first input (labeled input "0") is to be coupled to a third output (labeled output "3"), a second input (labeled input "1") is to be coupled to a first output (labeled output "0"), a third input (labeled input "2") is to be coupled to a second output (labeled output "1"), and a fourth input (labeled input "3") is to be coupled to a third output (labeled output "2"). Similar determinations may be made for routing between inputs, outputs and/or ports of any of the other topologies described herein. Accordingly, it may also be determined that a path needs to be provided between the respective ones of the inputs and outputs. The desired signal connectivity/routing may be provided in a desired signal connectivity/routing data structure 503, discussed in more detail below.

Method 500 may include modeling the switch as a sorting network, as depicted at block 504. In some embodiments, modeling the switch as a sorting network may include identifying a sorting network topology that corresponds to the switch topology. For example, corresponding sorting network topology may be identified in a manner similar to that described with respect to block 404 of FIG. 6. In some embodiments, a sorting network model for the switch may have been predetermined. For example, the switch may already have been associated with a given sorting network topology such that the model is retrieved for use. In the instance of a switch component operated by a computer system, the computer system may execute a hardware driver application that identifies the switch type and associates a given sorting network model to the switch based on the identified switch type. For example, where switch system 117' is installed in a switch system, a driver application may retrieve or otherwise associate sorting network model 122' with the switch system 117'. Such driver may implement sorting network modeling (e.g., one or more portions of method 500) to assess and implement operations of switching elements to provide a desired signal connectivity/routing through the corresponding switch matrix. The modeled switch matrix may be provided in switch matrix data structure 505, as discussed in more detail below.

If it is determined that for a switch matrix (e.g., composed of 2×2 switching elements), there is a topologically analogous sorting network composed of 2×2 comparators, then there may be an "O(n)" algorithm for configuring the switching elements to provide desired signal connectivity/routing (e.g., where "n" is the number of switching elements). A switch matrix data structure (505) may include a listing of elements, where each of the elements corresponds to a respective switching element of the matrix. Each element of the listing may describe inputs and outputs of the respective switching element. For 2×2 switching elements, for example, each element of the listing may describe (1) a first input (2) second input (3) first output; and (4) second output of the respective switching element. As depicted and described herein with respect to the switch matrix topologies, each input/output may be coupled to an input/output of the matrix or an input/output of an adjacent switching element. It may be assumed that matrices are directional, meaning that an input connection for some switching element connects to some output connection of another switching element or input to the matrix, and an output connection connects to some input connection of another switching element or output of the matrix. Thus, an ordering of the 2×2 switches in the matrix may exists such that for any switch in the list (1) its inputs come from either (a) an input to the matrix or (b) an output of a previous switch in the listing, and (2) its outputs go to either (a) an output of the matrix or (b) an input connection of a subsequent switching element of the listing.

Switch matrix data structure 505 may include an ordered listing. For example, a switch matrix data structure for the A-type matrix of FIGS. 2A-2C may include the following ordered listing:

(InPin0, InPin1, S2In0, S3In0)
(InPin2, InPin3, S2In1, S3In1)
(S0Out0, S1Out0, OutPin0, S4In0)
(S0Out1, S1Out1, S4In1, OutPin3)
(S2Out1, S3Out0, OutPin1, OutPin2)

where the first, second, third, forth and fifth rows of the listing, correspond to switching elements 102, 102c, 102b, 102d and 102e, respectively. For example, InPin0 may correspond to the path from input 0, InPin1 may correspond to the path from input 1, S2In0 may correspond to the output coupled to the first input of switching element 102b, and S3In0 may correspond to the output coupled to the first input of switching element 102d. The nomenclature may be similar for each of the rows and the respective paths to and from the corresponding switching element.

Desired signal connectivity/routing data structure 503 may include a list of "k" pairs, where the first element is the name of the input pin, and the second element is the name of the output pin to which it is to be connected through the switch matrix. For example, with regard to FIGS. 2A-2C, "k" may be equal to four (based on the four inputs and four outputs) and where input 0 is to be connected to output 1, a corresponding one of the pairs may include (0,1). Three additional pairs may be providing to designate the connections between the remaining three inputs and outputs. Since there are equal numbers of inputs and outputs, if certain inputs did not have desired routing, there may be an equal number of unspecified outputs, and these inputs and outputs can be paired in any fashion as a desired routing between them is not specified. Desired signal connectivity/routing data structure 503 may be stored in a memory.

Method 500 may include applying sorting, as depicted at block 502. In some embodiment applying sorting includes applying sorting to the model of the switch to obtain information on how to obtain the desired signal connectivity/routing through the switch. For example, with regard to the desired signal connectivity/routing identified at block 502 with regard to FIGS. 2A and 2B, sorting may be applied as illustrated to obtain conditions of the 2×2 switching elements that provide the desired routing. For example, for each input an element may be provided that corresponds to the desire destination of the element and the routing of a corresponding signal to be routed through the switch. In the illustrated embodiment, for example, element identifier "3", "0", "1" and "2" are arranged in the particular sequence for inputs "0"-"3" of switch topology 100'. Applying sorting may also include executing a sorting algorithm (e.g., "O(n)" algorithm) and indicating a path for each of the elements through the wires and connectors of the model and/or the conditions of connectors to provide the paths. Identifying the path may enable a condition of each of the connectors to be determined, or vice versa. In some embodiments, the sorting may simply provide an indication of the states of some or all of the switching elements (e.g., based on sates of comparators/connectors of the respective model) as providing an exchange/swap or not providing an exchange/swap. The path and/or indications may be stored in memory (e.g., in a switch configuration data structure 507), forwarded or output for use in additional processing.

In some embodiments, applying sorting may include providing switch matrix data structure 505 and desired routing data structure 503 as two inputs to a corresponding sorting algorithm corresponding to the model of the switch matrix. The sorting algorithm may require two storage structures: (1) a partial routing data structure (e.g., a list of n pairs indicating the target matrix output pin for each switching element output—hence n entries of the first output connection and the second output connection); and (2) a switch configuration data structure 507 (e.g., a list of n values indicating whether each switching element should be configured to route its inputs straight through or swap them to the opposite outputs). Both of these data structures may be uninitialized to begin with.

The configuration algorithm considers each element of switch matrix data structure 505 once, in order (e.g., line-by-line of the listing). For each input connection of the switching element corresponding to the element, the algorithm may determine whether the input connection is an input to the switch matrix ("InPinX") or an output connection of another one of the switching elements ("SYOutZ"). If it is determined that the input connection is an input to the switch matrix, the algorithm may include looking up the corresponding desired output pin for that input pin in the desired routing data structure. If, instead, the input is an output connection of another one of the switching elements, the algorithm may include looking up the desired output pin for that output connection in the partial routing data structure. Note that because the switch matrix data structure is ordered, the partial routing data structure may be initialized for any switch outputs that need to be looked up by the time they are encountered. After these look-ups are performed for both input connections of the switching element, the algorithm may include comparing the desired output pin for the first input connection to that for the second input connection. If they are already ordered, then the switch configuration data structure may be updated to reflect that that this particular switching element should connect the inputs to outputs straight through, and if the desired output pins presented on the input connections are out of order, then the switch configuration data structure may be updated to reflect that that this particular switching element should swap its inputs to its outputs. In both instances, the partial routing data structure is updated with the two desired outputs in the correct order on the two output connections. Upon each iteration through the switch matrix data structure, the corresponding element of the switch configuration data structure written with the setting/state for that switching and partial routing data structure is updated to correspond to the setting/states. When all the elements of the switch matrix have been considered, the configuration for the desired routing has been computed, and is stored in switch configuration data structure 507. The partial routing data structure may be discarded, while switch configuration data structure 507 may be used to actually configure the physical switching elements.

Method 500 may include determining a switching scheme, as depicted at block 510. In some embodiments, determining a switching scheme may include determining how to configure elements with the given topology to implement the paths. In some embodiments, the determination of how to route signals through the switch is based on the sorting at block 506. For example, the paths and corresponding conditions of the 2×2 switching elements of the switch may be determined based on the states of corresponding connectors of the network sorting model (e.g., listed in switch configuration data structure 507) as a result of the applied sorting. That is, the state of each of the 2×2 switching elements may be determined based on the states of the corresponding connectors/comparators/switching-elements of the sorting network model observed as a result of the sort. With regard to sorting network model 122' of FIG. 2C, and topology 100' and switch system 117', it may be determined that switching element 102a (corresponding to connector 124a) is to be operated in a state to swap signals, switching element 102b is to be operated to pass signals straight-through (as indicated by the non-swapped positions of "0" and "1" at nodes of connector 124b), switching element 102c is to be operated to pass signals straight through (as indicated by the non-swapped positions of "1" and "2" at nodes of connector 124c), switching element 102d (corresponding to connector 124d) is to be operated in a state to swap signals, and switching element 102e is to be operated to swap signals (as indicated by the swapped positions of "1" and "2" at nodes of connector 124e). Similar determinations may be made for paths and switching elements of any of the other sorting network topologies described herein. In some embodiments, signal routing may be provided by a user (e.g., manually input via a user interface) or may be generated via execution of software/applications to provide conditions of switch elements to obtain the desired signal connectivity/routing.

In some embodiments, determining a switching scheme may include assessing the determined signal routing to identify one or more signal paths that may provide the determined signal routing. For example, with regard to the routing of FIG. 1B it may be determined that paths 116a, 116b and 116c may provide the desired routing. Similar determinations may be made for paths through any of the other topologies described herein. In some embodiments, signal routing may be provided by a user (e.g., manually input via a user interface) or may be generated via execution of software/applications that outputs a desired signal connectivity/routing.

In some embodiments, determining a switching scheme may include determining how to configure switching elements with the given topology to implement the paths. For example, with regard to path 116a of FIG. 1B, it may be determined that the first and second switching elements are to be provided in a "swap" state (e.g., routing a first and second inputs to second and first outputs, respectively), and the third, fourth, fifth and sixth switching elements are to be provided in a "straight-through" state (e.g., routing a first and second inputs to first and second outputs, respectively). Similar determinations may be made for paths through any of the other components (e.g., multiplexers) and topologies described herein. The states of the switching elements may be listed in and retrieved from switch configuration data structure 507.

In some embodiments, assessing the determined signal routing to identify one or more signal paths that may provide the determined signal routing and/or determining how to configure elements with the given topology to implement the paths may be implemented via retrieving pre-stored data indicative of how to configure the elements. For example, in some embodiments, a look-up-table (LUT) may be generated and stored that includes a state for each component of the switch for every possible configurations. The LUT may be generated via application of a sorting algorithm for some or all of the possible routing conditions. Upon determining a given signal routing, the look-up-table may be searched for a configuration that matches the given signal routing, and the given states of each component (e.g., multiplexer, switching element, etc.) for the matching configuration may be determined as the switching scheme. In some embodiments, the LUT may be predetermined and pre-stored in a memory location, and may be accessed for making the determination(s). In some embodiments, the LUT includes a binary word (0 or 1) for each component in each configuration that represents the state of the component in that configuration (e.g., swap or straight-through). In some embodiments, the solutions provided in the LUT may be determined based on routing determinations similar to those discussed herein.

In some embodiments, assessing the determined signal routing to identify one or more signal paths that may provide the determined signal routing and/or determining how to configure elements with the given topology to implement the paths may be implemented via execution of a software routine. For example, in some embodiments, a sorting network switch matrix (e.g., a switch matrix having a switching topology that can be modeled as a sorting network) may be solved using a sorting algorithm. In some embodiments, the switch topology is modeled in network notation (e.g., a sorting network model), as represented by FIGS. 1D, 2C, 3C and 5, and a sorting algorithm is applied to the sorting network model to solve for the conditions of each of the components (e.g., a switching scheme) to implement the determined signal routing. In some embodiments, a software routine may be executed to dynamically determine all possible input configurations (e.g., creating a catalog of all possible paths from a given input), and then use a search and replace algorithm to build a complete solution (e.g., complete switching scheme).

Method 500 may include implementing the switching scheme, as depicted at block 510. Implementing the switching scheme may include setting the state (e.g., conditions (e.g., swap or straight-through) of components (e.g., switching element) in accordance with the switching scheme determined at block 504, as described above. Once executed, the desired paths may be provided such that signals may be routed on the desired paths between inputs and outputs, as depicted at block 508.

Some of the embodiments described herein implement a N×N (e.g., 2×2, 4×4, 8×8, etc.) switching element. The described 2×2 switching elements may include two distinct inputs and two distinct outputs. During use, the switching elements may be operated between two distinct states. A first state (e.g., a straight-through or pass-through state) that connects the first input to the first output and simultaneously connects the second input to the second output, and a second state (e.g., a swap state) that connects the first input to the second output and simultaneously connects the second input to the first output. During use, internal relays may couple their inputs to opposite outputs. The internal relays may be commanded to change between states at the same, or substantially the same time, such that outputs of the internal relays may not simultaneously couple to the same output. Accordingly the signals routed thereby remain isolated from one another and are passed straight through or swap routes through the 2×2 switching element. Such 2×2 switching elements may be provided in various forms, including, but not limited to those described below with respect at least FIGS. 8-12B. Although the paths/terminals are discussed with regard to inputs and outputs to provide clarity and consistency with regard to input/output (I/O) paths/terminals labeled as inputs (e.g., inputs 104) and outputs (e.g., outputs 106), in some embodiments, the resulting conductive path may be used to route signals in either direction (e.g., from outputs to inputs of from inputs to outputs).

As described below with respect to at least FIG. 14, pairs/sets of signals may be routed in a substantially similar manner by employing, at each of the switching element locations 102, multiple 2×2 or larger switching elements to effectively provide functionality of multi-wire signal routing. Some or all of 2×2 switching elements 102 may be other types of switching elements, such as 4×4 switching elements, 8×8 switching elements, and so forth, while still preserving the overall topology of the switching network (e.g., Cylindrical, J-type, or sorting). As described below with respect to at least FIG. 15, much larger multi-dimensional switching systems may be created by employing, at each of the switching element locations 102, multi-dimensional switching elements (e.g., 4×4 and 8×8), each of which may itself be a different topology (e.g., Cylindrical, J-type, sorting network, or even conventional crosspoint) as long as it forms a valid N×N switch matrix. For example, FIG. 15 includes a 16×16 switch matrix of the A-type sorting network topology, identical to that of FIG. 2A, except that each switch element 102 includes an 8×8 switch matrix of unspecified topology.

Switching elements 102 may be formed from one or more relays. The relays may be mounted onto a PCB, as described herein. In some embodiments, switching elements 102 may include micro-electric machined systems (MEMs) relay.

Figure 8:
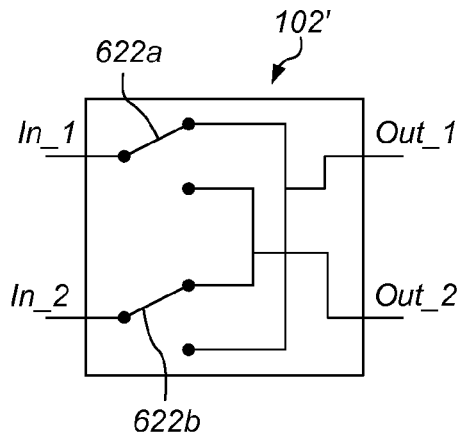
FIG. 8 is a schematic diagram that illustrates a switching element in accordance with one or more embodiments of the present technique.

FIG. 8 is a schematic diagram that illustrates a switching element 102' in accordance with one or more embodiments of the present technique. Some or all of switching elements 102 may be implemented using switching element 102' described herein. Switching element 102' may include a 2×2 switch having a first input (In_1), a second input (In_2), a first output (Out_1), and a second output (Out_2). The inputs (In_1 and In_2) and outputs (Out_1 and Out_2) may be the same as inputs 109 and outputs 108 of switching elements 102.

In a first state (depicted), first input (In_1) is coupled to the first output (Out_1) and second input (In_2) is coupled to the second output (Out_2). Thus, a signal received at the first input (In_1) is routed to the first output (Out_1) and a signal received at the second input (In_2) is routed to the second output (Out_2). In the first state, the signal may be said to route straight though the switching element (e.g., from first input (In_1) to the first output (Out_1)). In a second state, the routing is reversed such that first input (In_1) is coupled to the second output (Out_2) and the second input (In_2) is coupled to the first output (Out_1). Thus, a signal received at the first input (In_1) is routed to the second output (Out_2) and a signal received at the second input (In_2) is routed to the first output (Out_1). In the second state, the signal may be said to switch/swap routes though the switching element (e.g., from first input (In_1) to the second output (Out_2)).

Circuitry inside of switching element 102' may be provided in a corresponding first or second state to control the routing of signals via switching element 102'. For example, in a first state (depicted) wiper 622a may be provided in a first state that couples the first input (In_1) to the first output (Out_1), and wiper 622b may be provided in a first state that couples the second input (In_2) to the second output (Out_2). Conversely, in a second state wiper 622a may be provided in a second state that couples the first input (In_1) to the second output (Out_2), and wiper 622b may be provided in a second state that couples the second input (In_2) to the first output (Out_2). One or more commands/signals may be provided to switching element 102' to set the state of switching element 102'. In some embodiments, each of wipers 622a and 622b may be a 1-Form-C relay. In some embodiments, switching element 102' may be effectively implemented as a single 2-Form-C relay. In some embodiments, multi-dimensional switching elements (e.g., 4×4, 8×8, etc.) may be formed using multiple 2×2 switching elements 102', or integrating 2×, 4×, etc, the number of components integrated into a single switching element to provide similar routing of additional signals.

Figure 9:
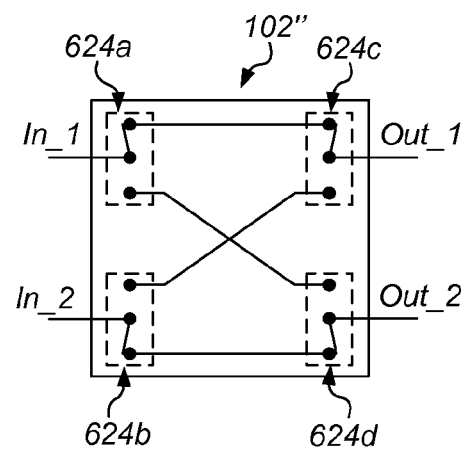
FIG. 9 is a schematic diagram that illustrates a multiplexer switching element in accordance with one or more embodiments of the present technique.

FIG. 9 is a schematic diagram that illustrates a multiplexer switching element 102" in accordance with one or more embodiments of the present technique. Some or all of switching elements 102 may be implemented using switching element 102". Switching element 102" may include a 2×2 switching element having a first input (In_1), a second input (In_2), a first output (Out_1), and a second output (Out_2). The inputs (In_1 and In_2) and outputs (Out_1 and Out_2) may be the same as inputs 109 and outputs 108 of switching elements 102. Signals may be routed straight through or swapped as described with respect to switching element 102 and 102'.

Switching element 102" may include a plurality of relays provided in various states to route signals. For example, in the illustrated embodiment, switching element 102''' includes first, second, third and fourth relays 624a-624d coupled to the first input (In_1), the second input (In_2), the first output (Out_1) and the fourth output (Out_2), respectively. Circuitry of switching element 102" may be provided in a first or second state to control the routing of signals via switching element 102". For example, in a first state (depicted) wipers of the relays 624a-624d may be provided in a first state that couples the first input (In_1) to the first output (Out_1) and couples the second input (In_2) to the second output (Out_2). Conversely, in a second state the wipers may be provided in an opposite position that couples the first input (In_1) to the second output (Out_2) and couples the second input (In_2) to the first output (Out_2). One or more commands/signals may be provided to switching element 102" to set the state of switching element 102". In some embodiments, each of relays 624a-624d may be a 1-Form-C relay. In some embodiments, switching element 102' may be effectively implemented as a single 2-Form-C relay. In some embodiments, multi-dimensional switching elements (e.g., 4×4, 8×8, etc.) may be formed using multiple 2×2 switching elements 102", or integrating 2×, 4×, etc, the number of components integrated into a single switching element to provide similar routing of additional signals.

In some embodiments, some or all of switching elements 102' and 102" may be implemented using a single 2-Form-C relay. In such an embodiment, a 2-Form-C relay may be provided at each of the locations of switching elements 102. For example, a plurality of 2-Form-C relay, may be provided on a front side of PCB 120 to provide the topologies and switch systems described herein. In some embodiments, a complementary relay may not need to be provided on a back side of PCB 210.

In some embodiments, switching element 102' may be implemented using two distinct 1-Form-C relays coupled to one another. In such an embodiment, two 1-Form-C relay may be provided at each of the locations of switching elements 102. For example, a first 1-Form-C relay may be provided on a front side of PCB 120 at each of switching elements 102, and a second complementary 1-Form-C relay may be provided on a front or back/opposite side of PCB 120 at each of switching elements 102. The two 1-Form-C relays may provide the similar two state switchable/swappable routing described with respect to elements 102, 102' and 102".

Figure 10:
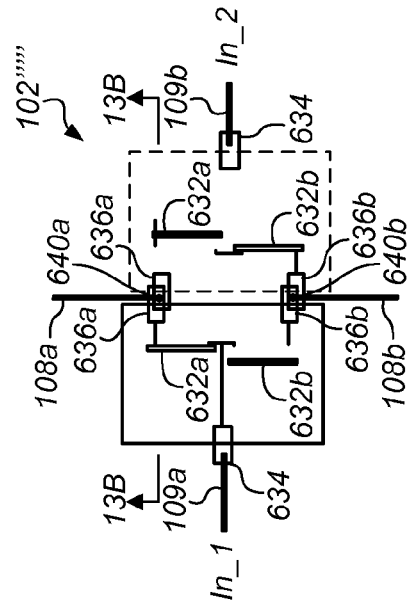
FIGS. 10-12B are schematic diagrams that illustrate switching elements in accordance with one or more embodiments of the present technique.
Figure 12A:
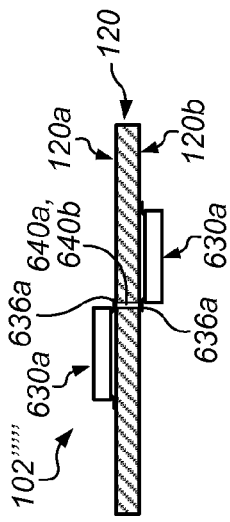
Figure 11:
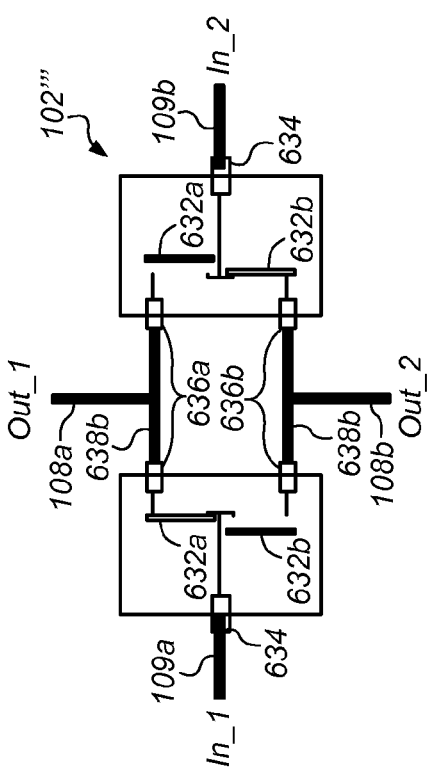
Figure 12B:
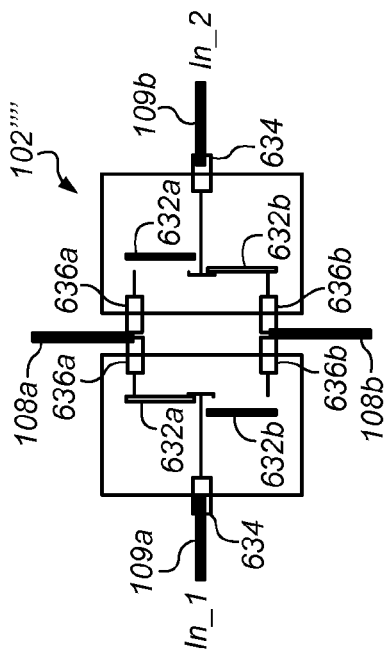

FIGS. 10-12B are schematic diagrams that illustrate switching elements 102''', 102'''', and 102''''' in accordance with one or more embodiments of the present technique. FIG. 10 is a schematic diagram that illustrates a switching element 102''' including two 1-Form C relays 630a and 630b disposed proximate one another, in accordance with one or more embodiments of the present technique. FIG. 11 is a schematic diagram that illustrates a switching element 102'''' including two 1-Form C relays 630a and 630b having terminal abutting one another (e.g., in near contact or in contact with one another), in accordance with one or more embodiments of the present technique. FIG. 12A is a schematic diagram that illustrates a switching element 102''''' including two 1-Form C relays 630a and 630b inverted with respect to one another, in accordance with one or more embodiments of the present technique. FIG. 12B is a diagram that illustrates a cross-sectioned view of switching element 102''''' of FIG. 12A taken across line 12B-12B in accordance with one or more embodiments of the present technique.

Some or all of switching elements 102 may be implemented using switching elements 102''', 102'''' and 102''''' described herein. Switching elements 630a and 630b may each include a 1-Form-C relay. In the illustrated embodiment, each of relays 630a and 630b include an input (In_1, In_2), and first and second common outputs (Out_1) and (Out_2). Outputs (Out_1 and Out_2) and inputs (In_1 and In_2) may be the same or similar to outputs 109 and inputs 108 of switching elements 102. Each of relays 630a and 630b may include wipers 632a and 632b that are operated between open and closed states to provide for selectively connecting their respective input (In_1 or In_2) to one of their respective outputs (Out_1 or Out_2). During use, relays 630a and 630b may be provided in the same states simultaneously (e.g., wipers 632a closed with wipers 632b opened) such to connect their inputs to opposite outputs for routing of signals there between. For example, in the illustrated embodiments, wipers 632a are closed with wipers 632b opened in a first state, thereby connecting the first input (In_1) to the first output (Out_1) and connecting the second input (In_2) to the second output (Out_2), such that a signal received at the first input (In_1) is routed to the first output (Out_1) and a signal received at the second input (In_2) is routed to the second output (Out_2). In a second state, the positions of the relays may be reversed such that wipers 632a are opened with wipers 632b closed, thereby connecting the first input (In_1) to the second output (Out_2) and connecting the second input (In_2) to the first output (Out_1), such that a signal received at the first input (In_1) is routed to the second output (Out_2) and a signal received at the second input (In_2) is routed to the first output (Out_1). During use, relays 630a and 630b may couple their inputs to opposite outputs. Relays 630a and 630b may be commanded to change between states at the same or substantially the same time such that outputs of relays 630a and 630b do not simultaneously couple to the same output. Accordingly the signals routed thereby remain isolated from one another and are passed straight through or swap routes through the switching element.

Relays 630a and 630b may each include an input terminal and two output terminals. For example, in the illustrated embodiments, relays 630a and 630b each include an input terminal 634 coupled to their respective inputs (In_1 and In_2), as well as two output terminals 636a and 636b coupled to the first and second outputs (Out_1 and Out_2), respectively. The terminals, and thus, the inputs and outputs may be connected/coupled to conductive paths (e.g., traces and/or vias), such as interconnects 107. In the illustrated embodiment, the terminals are coupled to a first input path 109a, a second input path 109b, a first output path 108a and a second output path 108c.

In some embodiments, switching element 102 may include two relays disposed proximate one another. For example, as depicted in FIG. 10, switching element 102''' comprises two relays disposed end-to-end such that their terminals 636a and 636b face one another. In some embodiments, relays 630a and 630b may be two same or similar 1-Form-C relays disposed in the same side of a PCB, rotated about one-hundred eighty degrees relative to one another such that they are arranged end-to-end with respect to one-another. In some embodiments, the terminals may be located some distance form one another. For example, pairs of terminals 636a and 636b are located some distance from one another which is spanned by interconnects 638a and 638b, respectively. Interconnects 638a and 638b may each include a trace disposed on or within a PCB (e.g., PCB 120). Notably, the presence of such interconnects may creates an effective "stub" that can introduce reflections and, thus, signal interference during use. For example, where a signal is routed by switching element 102' from the first input (In_1) to the first output (Out_1), a portion of the signal may travel down the "stub" or "dead-end" path toward terminal 636a of relay 630b, where it is reflected due to the disconnect of wiper 632b. In some embodiments, the distance between each of the pairs of terminals is reduced to reduce the effective stub length. For example, the distance between the pairs of terminals 636a and 636b may be leas than about ten millimeters (mm), nine mm, eight mm, seven mm, six mm, five mm, four mm, three mm, two mm, or one mm. In some embodiments, the distance between the pairs of terminals is effectively eliminated. For example, as depicted in FIG. 12, switching elements includes pairs of terminals 636a and 636b that disposed adjacent one another. In some embodiments, terminals 636a and/or 636b may abut one another. In some embodiments, terminals 636a and/or 636b may overlap one another. For example, terminal 636a of relay 630a may be soldered on top of terminal 636a of relay 630b. The resulting close proximity of the terminals may effectively reduce the stub length, thereby decreasing reflections and improving the quality of the signal routing.

In some embodiments, relays may be disposed in an inverted relationship with respect to one another. For example, as depicted in FIGS. 12A and 12B, switching element 102"" includes two relays 630a and 630b disposed on opposite sides/faces 120a and 120b of PCB 120 and flipped about one-hundred eighty degrees relative to one another such that the "bottom" of each of the relays faces one another. In some embodiments, the terminals of the relays may be disposed atop one another such that the terminals are directly or substantially vertically aligned with one another. The first outputs (Out_1) and the second outputs (Out_2) may terminate (e.g., soldered or other wise connected to) a conductive path, such as vias 640a and 640b, respectively. Although the depicted embodiment includes terminals 636a and 636b at least substantially vertically aligned with one another, other embodiments may include similarly inverted relays having terminals that are vertically offset. For example, relays 630a and 630b of switching elements 102''' and 102"" of FIGS. 10 and 11 may be provided in a similar inverted relationship while maintaining a similar lateral/horizontal spacing, as depicted.

Although the embodiments described above with respect to switching elements 102'-102"" have been described with respect to a particular arrangement of inputs and outputs to simplify the discussion, it will be appreciated that other embodiments may include the reversal of signal routing directions and notations. For example, a signal may be received at each of the outputs (Out_1 or Out_2) and selectively routed to either of the inputs (In_1 or In_2) using the same techniques for providing a connection between the terminals and paths.

Figure 13:
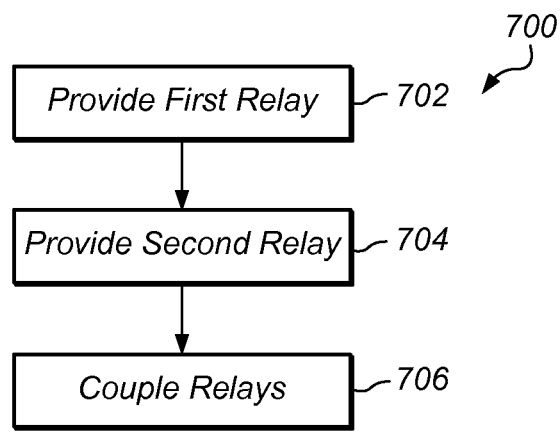
FIG. 13 is a flowchart that illustrates a method of manufacturing switching element in accordance with one or more embodiments of the present technique.

FIG. 13 is a flowchart that illustrates a method 700 of manufacturing switching element (e.g., element 102'-102"'") in accordance with one or more embodiments of the present technique. Method 700 may include providing a first relay, as depicted at block 702. In some embodiments, providing the first relay includes disposing the first relay in a position and/or orientation similar to that of relay 630a described above with respect to switching elements 102, 102', 102" 102''', 102"", and/or 102"'". Method 700 may include providing a second relay, as depicted at block 704. In some embodiments, providing the second relay includes disposing the second relay in a position and/or orientation similar to that of relay 630a described above with respect to switching elements 102, 102', 102" 102''', 102"", and/or 102"'". For example with respect to switching element 102''' of FIGS. 12A and 12B, the first relay may be disposed on a first side of a PCB, and the second relay may be disposed on a second/opposite side of the PCB. Method 150 may also include coupling the relays, as depicted at block 706. Coupling the relays may include coupling the terminals of the relays to conductive paths and or other terminals, as described above with respect to switching elements 102, 102', 102" 102''', 102"", and/or 102"'". For example, one or more vias and/or traces may be used to couple terminals of the first and second relays. In some embodiments, the vias and/or traces may extend through the same or different layers of the PCB.

Figure 14:
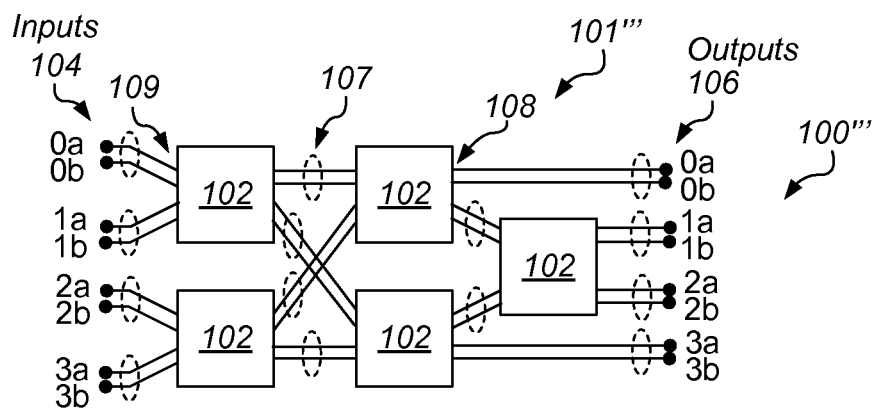
FIG. 14 is a schematic diagram that illustrates a multi-wire switch matrix in accordance with one or more embodiments of the present technique.

FIG. 14 is a schematic diagram that illustrates a multi-wire switch matrix topology 100''' in accordance with one or more embodiments of the present technique. In the illustrated embodiment, matrix topology 101''' includes eight inputs 104 and eight outputs 106, but is logically still a 4×4 switch matrix. Each of switching elements 102 includes four inputs and four outputs, but is logically still a 2×2 switching element. In some embodiments, each pair of inputs is always routed together for functional reasons (e.g., they represent the positive and negative polarity of an electrical signal). During use, each of switching elements 102 may route pairs of signals straight through, or may swap the pairs of signals. Thus, in some embodiments, switching elements 102 of switch matrix topology 101''' may be operated such that pairs of inputs may be routed to corresponding pairs of outputs, during use. The routes/paths of each signal of the pairs signals may be the same or substantially similar. For example, a pair of signals provided to a respective pair of inputs (0a,0b) may be each be routed straight through the first switching element, swap paths at the second switching element, and be routed straight through the third switching element, such that both of the pair of signals are routed to the pair of outputs (1a,1b) via substantially the same route.

In the illustrated embodiment, topology 100''' includes a multi-wire A-Type topology similar to that of A-type matrix topology 100' described with respect to FIGS. 2A-2C. Notably, such a multi-wire topology may essentially include two or more topologies "superimposed" upon one another. For example, two 2×2 switching elements may be provided at each location of switching elements 102 to provide the 2-wire switching element functionality of topology 100'''. Similar techniques may be employed for each of the switch topologies (e.g., cylindrical, J-Type, Mux-Mat-Mux, etc.) described herein. For example, a two-wire or eight-wire cylindrical matrix switch topology may be provided by implementing respective 2-wire or 8-wire switching elements at each of the locations of switching elements 102, and providing corresponding conductive paths there between.

Notably, the multi-wire switch matrices may be modeled as a network sorting notation model, manufactured, and employed in a manner similar to that described above. For example, a sorting network notation model may be applied to the topology 100''' in a manner similar to that described above with respect to topology 100' and associated methods described above with respect to at least FIGS. 2A-C, 7 and 8.

In the illustrated embodiment, topology 100"" includes an A-Type matrix topology similar to that of A-type matrix topology 100' described with respect to FIGS. 2A-2C but with increased channel count. Notably, such an expanded topology may essentially include two or more topologies nested within one another. For example, any topology of 8×8 matrix may be provided at each location of switching elements 102 to provide the 16×16 switching functionality of topology 100''''. Similar techniques may be employed for each of the switch topologies (e.g., cylindrical, J-Type, Mux-Mat-Mux, etc.) described herein. For example, a 16×16 cylindrical matrix switch topology may be provided by implementing respective 8×8 switching elements at each of the locations of switching elements 102, and providing corresponding conductive paths there between.

Figure 15:
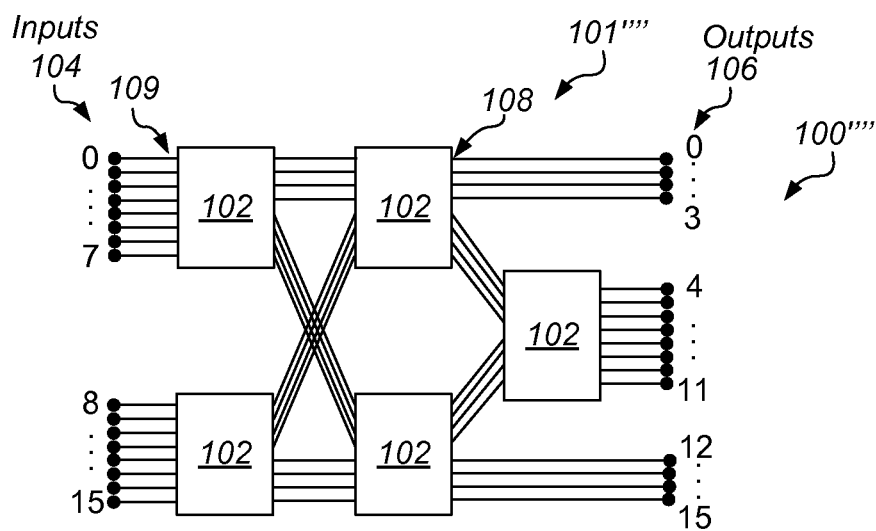
FIG. 15 is a schematic diagram that illustrates a switch matrix including 8×8 switching elements in accordance with one or more embodiments of the present technique.

Although several of the embodiments herein have been described with respect to switch matrices including 2×2 switching elements, other embodiments may employ the same or similar topologies to route an increasing number of signals using different numbers and types of switching elements. For example, one or more multi-dimensional (e.g., 4×4, 8×8, . . . n×n) switching elements may be used route an increasing number of signals. FIG. 15 is a schematic diagram that illustrates a switch matrix including 8×8 switching elements in accordance with one or more embodiments of the present technique. In the illustrated embodiment, matrix topology 101'''' includes sixteen inputs 104 and sixteen outputs 106. Each of switching elements 102 includes eight inputs and eight outputs (e.g., an 8×8 switching element) and is functionally an independent 8×8 switch matrix or sorting network. During use, each of switching elements 102 may route any of its input signals to any of its output signals. For example, in FIG. 15, half of the inputs (0, 1, 2, 3,4,5,6,7) may be applied to the first switching element which will sort them into descending order. The lesser valued (upper) four of those sorted signals will pass on to the second switching element and be combined with the lesser valued (upper) four signals from the other half of the inputs (8,9,10,11,12,13,14,15). The second switching element will re-sort those eight combined signals and pass the lesser valued four to the upper four outputs (0, 1, 2, 3), which are now clearly the lesser four of all sixteen inputs, and in correct descending order. Notably, the overall sorting topology is the same as that shown in FIG. 2A, but more signals are passed between switch elements.

Figure 16:
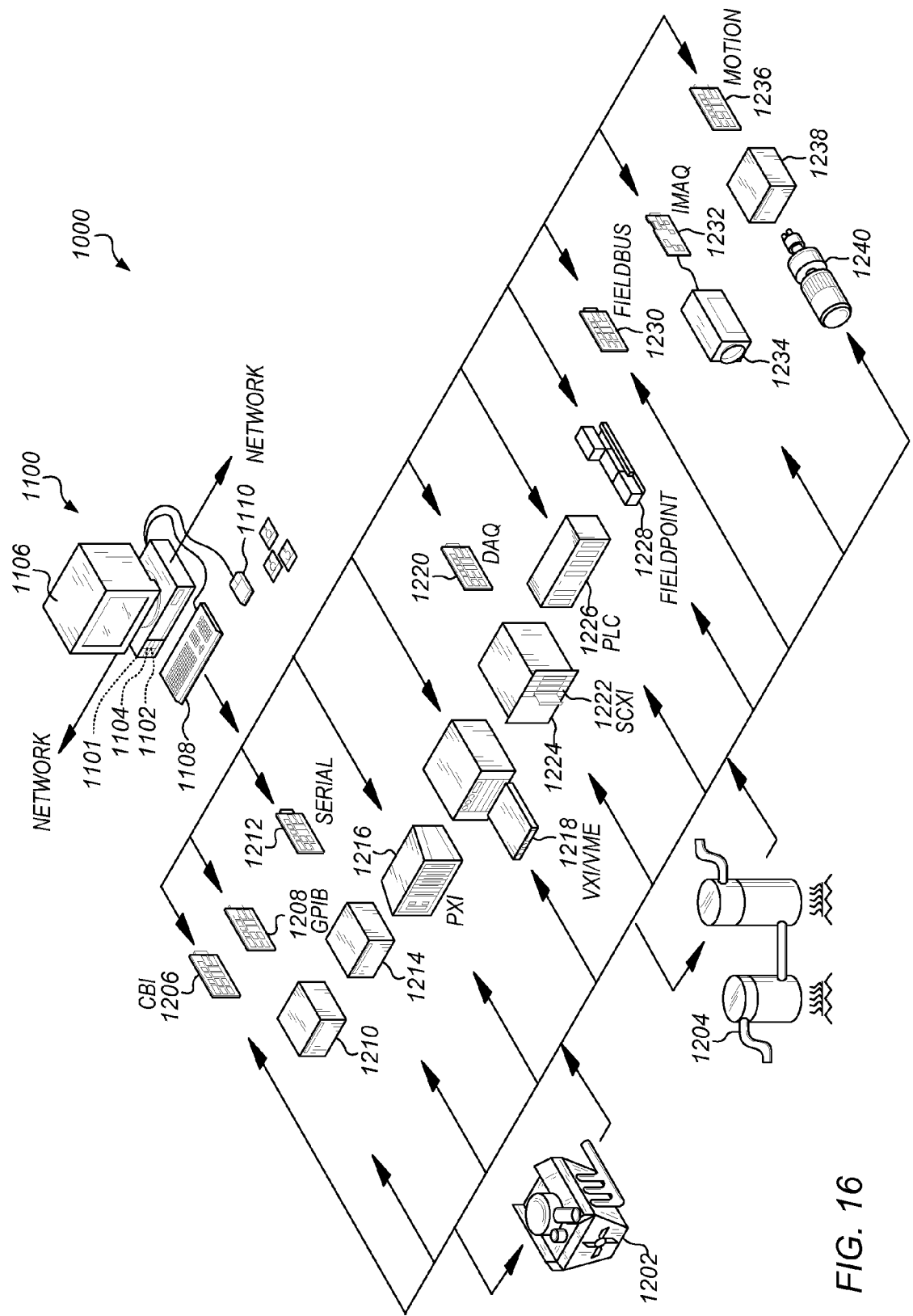
FIG. 16 illustrates an exemplary measurement/control system in accordance with one or more embodiments of the present technique.

In some embodiments, some or all of the above described techniques may be implemented via an application executed on a computer that facilitates communication with corresponding switch/relay hardware. FIG. 16 illustrates an exemplary measurement/control system ("computer system") 1000 in accordance with one or more embodiments of the present technique. Computer system 1000 may implement one or more embodiments of the present technique. For example, an application module stored an executed by computer system 1000 may be executed to implement solving and implementing switch conditions, modeling a switch via a sorting network, or the like. Computer system 1000 may include various combinations of hardware and software that include devices that can be used to implement various computer based processes.

In the illustrated embodiment, computer system 1000 includes a host computer system 1100. Host computer system 1100 may be operable to execute computer programs/routines that provide various computer related functions, such as those for employing a switch matrix as described herein. For example, instructions for implementing the techniques described herein may be stored an executed by one or more modules 1101 (e.g., a sorting module) of the computer systems/device of computer system 1000, such as host computer system 1100. Moreover, any of the switch topologies and related techniques described herein may be implemented in a switch/relay module provided within system 1000. Host computer system 1100 may include various components such as central processing unit (CPU) 1102 and a memory medium 1104. Memory medium 1104 may include a tangible non-transitory computer readable storage medium, such as random access memory (RAM), flash memory, hard-drives, and/or CD-ROMs, or the like. Memory medium 1104 may have program instructions stored thereon that are executable (e.g., by CPU 1102) to implement one or more computer implemented methods, such as those for employing a switch matrix as described herein as described herein. In the illustrated embodiment, host computer system 1100 includes a display device (e.g., a monitor) 1106, an alphanumeric input device (e.g., a keyboard) 1108, and a directional input device (e.g., a mouse) 1110. In some embodiments, host computer system 1100 may include modular and/or plug-in boards/cards (e.g., with either commercially available or proprietary hardware) that may be added via a number of expansion slots internal or external to the computer body. For example, host computer system 1100 may include PCI/PCI Express slots and PCI/PCI Express cards disposed therein. As described in more detail below, host computer system 1100 may be connected to one or more devices, such as an expansion chassis for connecting to a various number and combination of devices. In certain embodiments, host computer system 1100 and/or other portions of computer system 1000 may be connected to one or more other devices via a network, such as an internal network (e.g., a local area network (LAN)) and/or an external network (e.g., the internet). In certain embodiments, host computer system 1100 may be used for various input/output (I/O) functions and processing tasks. For example, host computer system 1100 may be used for data acquisition (DAQ) (e.g., when a DAQ digitizing board is installed in computer 1100 or a device coupled thereto, such as a chassis, and associated software is run).

Host computer system 1100 may be configured to connect/communicate with other instruments/devices of computer system 1000. In some embodiments, host computer system 1100 may operate with the one or more devices of computer system 1000 to generate and provide data, to acquire data, to analyze data. For example, computer system may communicatively couple to and control one or more devices 1202, processes 1204, or the like. In some embodiments, devices 1201 may include universal serial bus (USB) devices. Host computer system 1100 may operate with the one or more devices in communication with device 1202 or process 1204 to perform an automation function, such as MMI (Man Machine Interface), SCADA (Supervisory Control and Data Acquisition), portable or distributed data acquisition, process control, advanced analysis, or other data acquisition and control functions. For example, computer system 1000 may be used to implement data acquisition and control applications, test and measurement applications, image acquisition and processing application, machine vision processing applications, process control applications, man-machine interface applications, simulation applications, hardware-in-the-loop validation applications, motion control applications, computer based instruments (CBI) applications, signal conditioning (SCXI) applications, or the like. One or more of the instruments/devices of computer system 1000 may include a programmable hardware element, using an FPGA or a processor and memory, and/or one or more portions of user code.

Computer system 1000 may include a variety of devices. For example, computer system 1000 may include modular instrumentation devices, such test and measurement devices manufactured by National Instruments Corporation, headquartered in Austin, Tex. In some embodiments, computer system 1000 may include computer based instrumentation (CBI) 1206, such as a digital multi-meter (DMM), an oscilloscope (SCOPE), a radio-frequency (RF) device (e.g., up-converter or down-converter), an arbitrary waveform generator (ARB), or the like. Computer system 1000 may include general purpose interface bus (GPIB) device 1208, such as a modular GPIB card used to communicate with a GPIB device 1210 (e.g., an oscilloscope) via a GPIB communication protocol. Computer system 1000 may include a serial device 1212, such as a modular serial card used to communicate with a serial device 1214 (e.g., an oscilloscope) via a serial communication protocol. Computer system 1000 may include a (PXI) device 1216, such as a PXI chassis having PXI form factor modular devices (e.g., modules) installed therein. Computer system 1000 may include a (VXI/VME) device 1218, such as a VXI/VME chassis having VXI/VME form factor modular devices (e.g., VXI/VME controllers/modules) installed therein. Computer system 1000 may include data acquisition (DAQ) device 1220, such as modular instrumentation including data input/output (I/O) interfaces for receiving, transmitting, conditioning, and/or processing signals (e.g., digital and analog signals). Computer system 1000 may include signal conditioning (SCXI) devices 1222 that can be used to condition and/or route signals, such as I/O signals as those transmitted/received at DAQ device 1220. SCXI device 1222 may include a chassis 1224 having devices 1222 installed therein (e.g., a relay/switch module having a relay/switch matrix employing any one of the topologies described herein). Computer system 1000 may include a programmable logic controller (PLC) 1226, such as a PLC used for the automation of electromechanical process. Computer system 1000 may include a distributed I/O module, such as a field-point module 1228. Computer system 1000 may include a distributed control module, such as a fieldbus module 1230. Computer system 1000 may include an image acquisition (IMAQ) system, such as a modular IMAQ module 1232 and an associated IMAQ device (e.g., camera) 1234. Computer system 1000 may include a motion control system, such as a modular motion controller device 1236, a motor drive 1238, and a motor 1240. Computer system 100 may include any variety of other devices. Although some of the devices are illustrated in association with a chassis (e.g., modules) and some are illustrated independent from a chassis (e.g., card or standalone devices), embodiments may include all or some of the described device being provided in a module form factor to be housed in a chassis and/or a card form factor be installed in computer 1100. For example, PXI device 1216 may include a PXI chassis housing any combination of modular CBI devices, GPIB devices, serial devices, SCXI devices, DAQ devices, IMAQ devices, motion devices, or the like. For example a PXI form factor switch module having a relay/switch matrix a relay/switch matrix (e.g., employing any one of the topologies described herein) may be provided. In some embodiments, a switch may be provided on a carrier that is disposed in a PXI module housed in a PXI chassis. The devices may also be provided in a PCI form factor and installed in PCI slots of computer 1100. In some embodiments, computer system 1100 may include a test and measurement device, such as a digital millimeter (DMM). In some embodiments, the DMM may employ the techniques discussed herein to test relays of a switch coupled thereto. For example, the DMM may be used to measure the connectivity or resistance between two channels of the switch when appropriate as described above with regard to the test routine.

Computer system 1000 may store and/or execute a driver used to control one or more aspects of operation of computer system 1000. For example, where a switch module includes a switch system (e.g., switch system 117, 117' or 117"), a switch hardware/software driver application may retrieve or otherwise associate a sorting network model (e.g., model 122, 122' or 122") with the switch hardware. Such driver may implement sorting network modeling (e.g., one or more portions of method 500) to assess and implement operations of switching elements of the switch system to provide a desired signal connectivity/routing through the corresponding switch matrix and I/O ports of the switch module.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include", and derivations thereof, mean "including, but not limited to". As used in this specification, the singular forms "a", "an" and "the" include plural referents unless the content clearly indicates otherwise. Thus, for example, reference to "a device" includes a combination of two or more devices.

We claim:

1. A 2×2 switching element for routing analog signals, comprising:
    a first relay comprising a first terminal, a second terminal and a third terminal, wherein the first relay is configured to selectively operate between a first state configured to connect the first terminal of the first relay to the second terminal of the first relay and a second state configured to connect the first terminal of the first relay to the third terminal of the first relay; and
    a second relay comprising a first terminal, a second terminal and a third terminal, wherein the second relay is configured to selectively operate between a third state configured to connect the first terminal of the second relay to the second terminal of the second relay and a fourth state configured to connect the first terminal of the second relay to the third terminal of the second relay;
    wherein the first relay is disposed on a first face of a printed circuit board (PCB) and the second relay is disposed on a second face of the PCB that is opposite from the first face;
    wherein the second terminals of the first and second relays are coupled to one another, and comprise or are coupled to an input terminal of the 2×2 switching element configured to receive the analog signals;
    wherein the third terminals of the first and second relays are coupled to one another, and comprise or are coupled to an output terminal of the 2×2 switching element configured to output the analog signals; and
    wherein the 2×2 switching element is selectively operable between:
        a first switching state wherein the first relay is operated in the first state to connect the first terminal of the first relay to the second terminal of the first relay and the second relay is operated in the fourth state to connect the first terminal of the second relay to the third terminal of the second relay; and
        a second switching state wherein the first relay is operated in the second state to connect the first terminal of the first relay to the third terminal of the first relay and the second relay is operated in the third state to connect the first terminal of the second relay to the second terminal of the second relay;
    wherein the first terminal of the first relay is coupled to a first conductive path, the second terminal of the first and second relays are coupled to a second conductive path, the third terminals of the first and second relays are coupled to a third conductive path, and the first terminal of the second relay is coupled to a fourth conductive path, such that:

when the 2×2 switching element is operated in the first switching state, the 2×2 switching element is configured to route a signal between the first and second conductive paths and to route a signal between the fourth and third conductive paths; and when the 2×2 switching element is operated in the second switching state, the 2×2 switching element is configured to route a signal between the first and third conductive paths and to route a signal between the fourth and second conductive paths;

wherein the second terminals of the first and second relays are substantially vertically aligned with one another, and the third terminals of the first and second relays are substantially vertically aligned with one another, thereby reducing size of stubs in the first, second, third, and fourth conductive paths, resulting in effectively stubless conductive paths during operation, thereby reducing interference and associated capacitive loads.

2. The 2×2 switching element of claim 1, wherein the first and second relays each comprise 1-Form C relays.

3. The 2×2 switching element of claim 1, further comprising;

one or more vias coupling the second terminals of the first and second relays to one another and/or one or more vias coupling the third terminals of the first and second relays to one another.

4. The 2×2 switching element of claim 1, wherein the analog signals are radio frequency (RF) signals.

5. The 2×2 switching element of claim 1, wherein the second terminals of the first and second relays are disposed proximate one another and the third terminals of the first second relays are disposed proximate one another.

6. A method of manufacturing a 2×2 switching element for routing analog signals, comprising:

coupling a second terminal of a first relay to a second terminal of a second relay, wherein the second terminals of the first and second relays comprise or are coupled to an input terminal of the 2×2 switching element configured to receive the analog signals; and coupling a third terminal of the first relay to a third terminal of a second relay, wherein the third terminals of the first and second relays comprise or are coupled to an output terminal of the 2×2 switching element configured to output the analog signals;

wherein the first relay is disposed on a first face of a printed circuit board (PCB) and the second relay is disposed on a second face of the PCB that is opposite from the first face;

wherein the first relay comprises a first terminal, the second terminal and the third terminal, wherein the first relay is configured to selectively operate between a first state configured to connect the first terminal of the first relay to the second terminal of the first relay and a second state configured to connect the first terminal of the first relay to the third terminal of the first relay;

wherein the second relay comprises a first terminal, the second terminal and the third terminal, wherein the second relay is configured to selectively operate between a third state configured to connect the first terminal of the second relay to the second terminal of the second relay and a fourth state configured to connect the first terminal of the second relay to the third terminal of the second relay; and wherein the 2×2 switching element is selectively operable between:

a first switching state wherein the first relay is operated in the first state to connect the first terminal of the first relay to the second terminal of the first relay and the second relay is operated in the fourth state to connect the first terminal of the second relay to the third terminal of the second relay; and a second switching state wherein the first relay is operated in the second state to connect the first terminal of the first relay to the third terminal of the first relay and the second relay is operated in the third state to connect the first terminal of the second relay to the second terminal of the second relay;

coupling the first terminal of the first relay to a first conductive path;

coupling the second terminals of the first and second relays to a second conductive path;

coupling the third terminals of the first and second relays to a third conductive path; and coupling the first terminal of the second relay to a fourth conductive path, such that:

when the 2×2 switching element is operated in the first switching state, the 2×2 switching element is configured to route an analog signal between the first and second conductive paths and to route an analog signal between the fourth and third conductive paths; and when the 2×2 switching element is operated in the second switching state, the 2×2 switching element is configured to route an analog signal between the first and third conductive paths and to route another analog signal between the fourth and second conductive paths;

wherein the second terminals of the first and second relays are substantially vertically aligned with one another, and the third terminals of the first and second relays are substantially vertically aligned with one another, thereby reducing size of stubs in the first, second, third, and fourth conductive paths, resulting in effectively stubless conductive paths during operation, thereby reducing interference and associated capacitive loads.

7. The method of claim 6, wherein the first and second relays each comprise 1-Form C relays.

8. The method of claim 6, wherein the second terminals of the first and second relays are disposed proximate one another and the third terminals of the first and second relays are disposed proximate one another.

9. The method of claim 6, further comprising one or more vias coupling the second terminals of the first and second relays to one another and/or one or more vias coupling the third terminals of the first and second relays to one another.

10. The method of claim 6, wherein the analog signals are radio frequency (RF) signals.

* * * * *